US012660545B2

(12) United States Patent
Mizutani

(10) Patent No.: US 12,660,545 B2
(45) Date of Patent: Jun. 16, 2026

(54) WASHING SOLUTION AND WASHING METHOD FOR SEMICONDUCTOR SUBSTRATE

(71) Applicant: FUJIFILM Corporation, Tokyo (JP)

(72) Inventor: Atsushi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 374 days.

(21) Appl. No.: 18/452,311

(22) Filed: Aug. 18, 2023

(65) Prior Publication Data

US 2023/0402275 A1 Dec. 14, 2023

Related U.S. Application Data

(63) Continuation of application No. PCT/JP2022/004581, filed on Feb. 7, 2022.

(30) Foreign Application Priority Data

Feb. 22, 2021 (JP) ................................ 2021-026319

(51) Int. Cl.
*H10P 70/00* (2026.01)
*H10P 50/28* (2026.01)

(52) U.S. Cl.
CPC ............ *H10P 70/15* (2026.01); *H10P 50/283* (2026.01); *H10P 70/234* (2026.01); *H10P 70/27* (2026.01)

(58) Field of Classification Search
CPC ......... H01L 21/02052; H01L 21/02063; H01L 21/02068; H01L 21/31116; C11D 7/24; C11D 7/26; C11D 7/32

(Continued)

(56) References Cited

U.S. PATENT DOCUMENTS 5,279,771 A * 1/1994 Lee ......................... G03F 7/425 257/E21.255
2010/0043823 A1* 2/2010 Lee ..................... C11D 7/3263 134/1.3
2016/0252819 A1 9/2016 Sugishima et al.

FOREIGN PATENT DOCUMENTS

JP 11-194505 A 7/1999
JP 2015-118125 A 6/2015

(Continued)

OTHER PUBLICATIONS

Office Action issued Sep. 2, 2025 in Japanese Application No. 2023-500733.

(Continued)

*Primary Examiner* — Eisa B Elhilo
(74) *Attorney, Agent, or Firm* — Sughrue Mion, PLLC

(57) ABSTRACT

An object of the present invention is to provide a washing solution for a semiconductor device, the washing solution being excellent in the dissolution suppressing performance with respect to a metal layer containing tungsten and also being excellent in the washing performance of a dry etching residue. Another object of the present invention is to provide a washing method for a semiconductor substrate. The washing solution for a semiconductor device according to the present invention is a washing solution for a semiconductor device, containing one or more hydroxylamine compounds one selected from the group consisting of hydroxylamine and a hydroxylamine salt, a predetermined component A represented by Formula (1) described later, and water, in which a mass ratio of a content of the hydroxylamine compound to a content of the component A is 5 to 200.

21 Claims, 1 Drawing Sheet

(58) Field of Classification Search
USPC .......................................................... 510/176
See application file for complete search history.

(56) References Cited

FOREIGN PATENT DOCUMENTS

| | | | | | | |
|---|---|---|---|---|---|---|
| TW | 202204591 | A | * | 2/2022 | ............... | C11D 7/50 |
| WO | 2017/099211 | A1 | | 6/2017 | | |
| WO | 2017/119334 | A1 | | 7/2017 | | |
| WO | 2017/126554 | A1 | | 7/2017 | | |
| WO | WO 2018043440 | A1 | * | 3/2018 | ............... | C11D 7/07 |
| WO | WO 2018174092 | A1 | * | 9/2018 | ............... | C11D 7/32 |
| WO | WO 2021005980 | A1 | * | 1/2021 | ............... | C11D 7/50 |

OTHER PUBLICATIONS

International Search Report dated Apr. 19, 2022, issued in International Application No. PCT/JP2022/004581.
Written Opinion dated Apr. 19, 2022, issued in International Application No. PCT/JP2022/004581.
International Preliminary Report on Patentability (with translation of Written Opinion) dated Aug. 22, 2023, issued in International Application No. PCT/JP2022/004581.

* cited by examiner

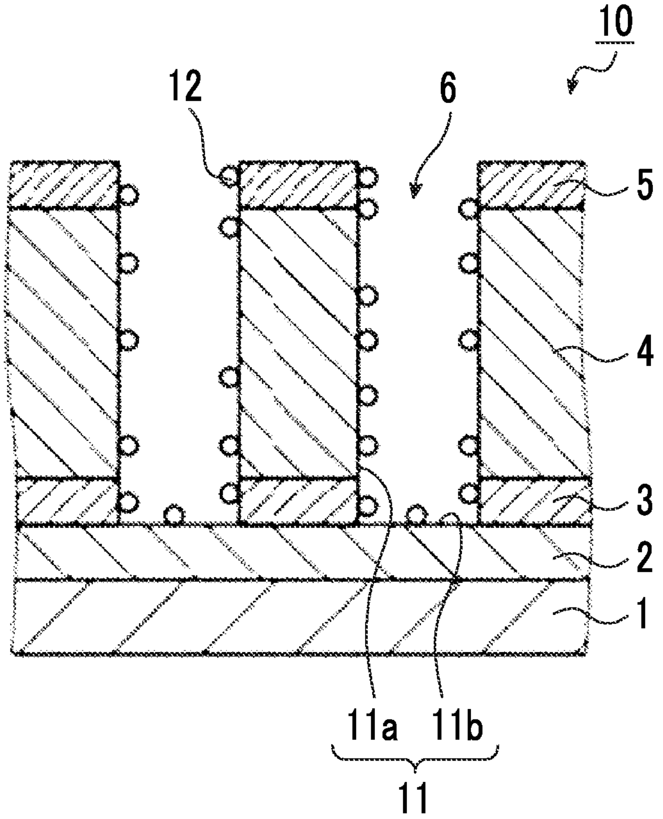
10
12
6
5
4
3
2
1
11a
11b
11

WASHING SOLUTION AND WASHING METHOD FOR SEMICONDUCTOR SUBSTRATE

CROSS-REFERENCE TO RELATED APPLICATIONS

This application is a Continuation of PCT International Application No. PCT/JP2022/004581 filed on Feb. 7, 2022, which claims priority under 35 U.S.C. § 119(a) to Japanese Patent Application No. 2021-026319 filed on Feb. 22, 2021. The above applications are hereby expressly incorporated by reference, in their entirety, into the present application.

BACKGROUND OF THE INVENTION

1. Field of the Invention

The present invention relates to a washing solution and a washing method for a semiconductor substrate.

2. Description of the Related Art

Semiconductor devices such as charge-coupled devices (CCD) and memories are manufactured by forming fine electronic circuit patterns on a substrate, using photolithography technology. The semiconductor devices are manufactured, for example, by disposing a laminate having a metal layer serving as a wiring line material, an etching stop film, and an interlayer insulating film on a substrate, forming a resist film on this laminate, and carrying out a photolithography step and a dry etching step (for example, a plasma etching treatment).

Specifically, in the photolithography step, the metal layer and/or the interlayer insulating film on the substrate is etched by a dry etching treatment using the obtained resist film as a mask.

In this case, residues derived from the metal layer and/or the interlayer insulating film and the like may adhere to the substrate, the metal layer, and/or the interlayer insulating film. In order to remove the adhered residues, washing using a treatment liquid is often carried out.

In addition, the resist film used as a mask during etching is then removed from the laminate by a dry-type method (dry ashing) by ashing (incineration), a wet-type method, or the like. The residues derived from the resist film or the like may adhere to the laminate from which the resist has been removed by using the dry ashing method. In order to remove the adhered residues, washing using a treatment liquid is often carried out. On the other hand, examples of the aspect of the wet-type method for removing the resist film include an aspect of removing the resist film using a treatment liquid.

As described above, the treatment liquid is used for removing residues (etching residues and ashing residues) and/or a resist film in the semiconductor device manufacturing step.

For example, WO2017/099211A discloses a washing solution for a substrate including a metal hard mask containing one or more specific metals, where the washing solution contains at least one hydroxylamine compound selected from hydroxylamine or a hydroxylamine salt, water.

SUMMARY OF THE INVENTION

As a result of studying a washing solution to be used for a semiconductor device with reference to the washing solution described in WO2017/099211A, the inventors of the present invention revealed that there is room for further improvement in the dissolution suppressing performance with respect to a metal layer containing tungsten serving as a wiring line material and/or a plug material, and the washing performance of the dry etching residue.

Therefore, an object of the present invention is to provide a washing solution for a semiconductor device, the washing solution being excellent in the dissolution suppressing performance with respect to a metal layer containing tungsten and also being excellent in the washing performance of a dry etching residue.

Another object of the present invention is to provide a washing method for a semiconductor substrate.

As a result of diligent studies to achieve the objects, the inventors of the present invention found that the objects can be achieved by the following configurations.

[1] A washing solution for a semiconductor device, comprising:

- a hydroxylamine compound that is at least one selected from the group consisting of hydroxylamine and a hydroxylamine salt;
- a component A represented by Formula (1) described later; and water,
- in which a mass ratio of a content of the hydroxylamine compound to a content of the component A is 5 to 200.

[2] The washing solution according to [1], further comprising alcohol.

[3] The washing solution according to [2], in which the alcohol includes a polyhydric alcohol having two or more hydroxy groups.

[4] The washing solution according to [2] or [3], in which the alcohol includes a compound represented by Formula (2) described later.

[5] The washing solution according to [4], in which the alcohol includes two or more kinds of the compounds represented by Formula (2) described later.

[6] The washing solution according to any one of [2] to [5], in which the alcohol includes at least one selected from the group consisting of 1,3-propanediol, 1,3-butanediol, 2-methyl-1,3-propanediol, glycerol, 2,4-pentanediol, 2,2-dimethyl-1,3-propanediol, and hexylene glycol.

[7] The washing solution according to any one of [2] to [6], in which the alcohol includes hexylene glycol.

[8] The washing solution according to any one of [1] to [7], in which the component A includes at least one selected from the group consisting of 2-(2-aminoethylamino)ethanol, 2,2'-oxybis(ethylamine), and 2-(2-aminoethoxy)ethanol.

[9] The washing solution according to any one of [1] to [8], in which the component A includes 2-(2-aminoethylamino)ethanol or 2,2'-oxybis(ethylamine).

[10] The washing solution according to any one of [1] to [9], in which a content of the component A is 0.10% to 10% by mass with respect to a total mass of the washing solution.

[11] The washing solution according to any one of [1] to [10], further comprising an azole compound.

[12] The washing solution according to any one of [1] to [11], further comprising a quaternary ammonium hydroxide.

[13] The washing solution according to [12], in which at least one of four hydrocarbon groups that are substituted in a quaternary ammonium cation contained in the quaternary ammonium hydroxide is a hydrocarbon group having two or more carbon atoms.

[14] The washing solution according to any one of [1] to [13], further comprising:

- a component B that is at least one kind selected from the group consisting of isobutene, (E)-2-methyl-1,3-pentadiene, 4-methyl-1,3-pentadiene, 2,2,4-trimethyloxetane, 4-methyl-3-pentene-2-ol, and 2,4,4,6-tetramethyl-1,3-dioxane, in which in a case where the washing solution contains one kind of the component B, a content of the component B with respect to a total mass of the washing solution is 0.1% by mass or less, and in a case where the washing solution contains two or more kinds of the components B, a content of each of the components B with respect to the total mass of the washing solution is 0.10% by mass or less.

[15] The washing solution according to any one of [1] to [14], further comprising:

a component C that is at least one kind selected from the group consisting of ethylenediamine and 2-aminoethanol, in which in a case where the washing solution contains one kind of the component C, a content of the component C with respect to a total mass of the washing solution is 5.0% by mass or less, and in a case where the washing solution contains two or more kinds of the components C, a content of each of the components C with respect to the total mass of the washing solution is 2.5% by mass or less.

[16] The washing solution according to any one of [1] to [15], in which a pH at 25° C. is 8 to 14.

[17] The washing solution according to any one of [1] to [16], in which a pH at 25° C. is 9 to 12.

[18] A washing method for a semiconductor substrate, comprising a washing step of washing a semiconductor substrate including a metal layer, by using the washing solution according to any one of [1] to [17].

[19] The washing method for a semiconductor substrate according to [18], in which the metal layer contains tungsten, and a dry etching residue adhering to the semiconductor substrate is removed by the washing step.

[20] The washing method for a semiconductor substrate according to [18] or [19], in which the semiconductor substrate has a layer containing cobalt or titanium nitride, and the dry etching residue adhering to the semiconductor substrate is removed by the washing step.

[21] The washing method for a semiconductor substrate according to any one of [18] to [20], in which the semiconductor substrate has an etching stop layer composed of aluminum oxide, and at least a part of the etching stop layer is removed by the washing step.

According to the present invention, it is possible to provide a washing solution for a semiconductor device, the washing solution being excellent in the dissolution suppressing performance with respect to a metal layer containing tungsten and also being excellent in the washing performance of a dry etching residue.

In addition, the present invention can provide a washing method for a semiconductor substrate.

BRIEF DESCRIPTION OF THE DRAWINGS

FIG. 1 is a schematic cross-sectional view illustrating an example of a laminate which is an object to be washed in a substrate washing method.

DESCRIPTION OF THE PREFERRED EMBODIMENTS

Hereinafter, the present invention will be described in detail.

Descriptions of the configuration requirements which will be described later are made based on representative embodiments of the present invention in some cases, but it should not be construed that the present invention is limited to such embodiments.

In the present specification, the numerical value range indicated by using "to" means a range including the numerical values before and after "to" as the lower limit value and the upper limit value, respectively.

In the present specification, the "preparation" is meant to include supplying a predetermined material by purchases or the like, in addition to providing specific materials by synthesis, combination, or the like.

In the present specification, in a case where two or more kinds of certain components are present, the "content" of the component means a total content of the two or more kinds of the components.

In the present specification, "ppm" means "parts-per-million ($10^{-6}$)", and

"ppb" means "parts-per-billion ($10^{-9}$)" and "ppt" means "parts-per-trillion ($10^{-12}$)".

In the present specification, 1 Å (angstrom) corresponds to 0.1 nm.

In addition, the present specification, in a case where there is no description regarding whether a group (atomic group) is substituted or unsubstituted, as long as the effect of the present specification is not reduced, the group includes both the group having no substituent and the group having a substituent. For example, the "hydrocarbon group" refers to not only a hydrocarbon group not having a substituent (unsubstituted hydrocarbon group) but also a hydrocarbon group having a substituent (substituted hydrocarbon group). This also applies to each compound.

In the present specification, light means actinic rays or radiation. In the present specification, the "radiation" means, for example, a bright line spectrum of a mercury lamp, far ultraviolet rays typified by an excimer laser, extreme ultraviolet rays (EUV rays), X-rays, or electron beams. Unless otherwise specified, the "exposure" in the present specification includes not only exposure with a mercury lamp, far ultraviolet rays represented by an excimer laser, X-rays, or EUV rays but also includes drawing with particle beams such as electron beams and ion beams.

[Washing Solution]

The washing solution according to the embodiment of the present invention (hereinafter, also described as "the present washing solution") is a washing solution containing one or more hydroxylamine compounds selected from the group consisting of hydroxylamine and a hydroxylamine salt, a component A represented by Formula (1) described later, and water, in which a mass ratio of a content of the hydroxylamine compound to a content of the component A is 5 to 200.

The inventors of the present invention found that in a case of containing a combination of the above-described components, the washing solution is excellent in the dissolution suppressing performance with respect to a metal layer containing tungsten and also is excellent in the washing performance of a dry etching residue, whereby the present invention was completed.

Hereinafter, regarding the washing solution or the washing method, the fact that any one of the dissolution suppressing performance with respect to a metal layer (a W-containing layer) containing tungsten or the washing performance of a dry etching residue is excellent is also referred to as that "the effect of the present invention is excellent".

Hereinafter, each component contained in the present washing solution will be described.

[Hydroxylamine Compound]

The present washing solution contains at least one hydroxylamine compound selected from the group consisting of hydroxylamine and a hydroxylamine salt.

In addition, in the present specification, "hydroxylamine" means the unsubstituted hydroxylamine ($NH_2OH$).

Examples of the hydroxylamine salt include inorganic acid salts and organic acid salts, where an inorganic acid salt formed by bonding a non-metal atom such as Cl, S, N, or P to a hydrogen atom is preferable, and a salt of any acid of hydrochloric acid, sulfuric acid, or nitric acid is more preferable. Specific examples of the inorganic acid salt of hydroxylamine include hydroxylamine nitrate, hydroxylamine sulfate, hydroxylamine hydrochloride, and hydroxylamine phosphate, and mixtures thereof.

In addition, an organic acid salt of hydroxylamine can also be used, and examples thereof include hydroxylammonium citrate, hydroxylammonium oxalate, and hydroxylammonium fluoride.

From the viewpoint that the effect of the present invention is more excellent, the hydroxylamine compound is preferably hydroxylamine or hydroxylamine sulfate and more preferably hydroxylamine.

One kind of the hydroxylamine compound may be used alone, or two or more kinds thereof may be used in combination.

The content of the hydroxylamine compound is, for example, 0.1% to 30% by mass with respect to the total mass of the washing solution, and it is preferably 0.3% to 20% by mass and more preferably 1% to 15% by mass from the viewpoint that the effect of the present invention is more excellent.

[Component A]

The present washing solution contains a component A represented by Formula (1).

$$NH_2—CH_2CH_2—X—CH_2CH_2—Y \quad (1)$$

In Formula (1), X represents —NR— or —O—, where R represents a hydrogen atom or a substituent, and Y represents a hydroxy group (—OH) or a primary amino group (—$NH_2$).

Examples of the substituent represented by R include a substituted or unsubstituted hydrocarbon group, where a substituted or unsubstituted alkyl group is preferable. The above-described hydrocarbon group and alkyl group may be either linear, branched, or cyclic. The above-described hydrocarbon group and alkyl group have, for example, 1 to 6 carbon atoms, preferably 1 to 3 carbon atoms, and more preferably 1 or 2 carbon atoms. Examples of the substituent which may be contained in the above-described hydrocarbon group and alkyl group include a hydroxy group and a primary amino group.

R is preferably a hydrogen atom or an alkyl group having 1 to 3 carbon atoms, which may have a hydroxy group or a primary amino group, more preferably a hydrogen atom or an ethyl group which may have a hydroxy group or a primary amino group, and still more preferably a hydrogen atom.

The number of amino groups contained in the component A is, for example, 1 to 5, and it is preferably 1 to 3, more preferably 1 or 2, and still more preferably 2.

The number of hydroxy groups contained in the component A is, for example, 0 to 4, and it is preferably 0 to 2 and more preferably 1 or 2.

The total number of amino groups and hydroxy groups contained in the component A is, for example, 3 to 5, and it is preferably 3 or 4 and more preferably 3.

Examples of the component A include 2-(2-aminoethoxy)ethanol, 2-(2-aminoethylamino)ethanol, 2,2'-oxybis(ethylamine), triethylenetetramine, N,N-bis(2-hydroxyethyl)ethylenediamine, 2-[bis(2-aminoethyl)amino]ethanol, N-methyl-N-(2-hydroxyethyl)ethylenediamine, and N-ethyl-N-(2-hydroxyethyl)ethylenediamine.

Among them, 2-(2-aminoethoxy)ethanol, 2-(2-aminoethylamino)ethanol, 2,2'-oxybis(ethylamine), or diethylenetriamine is preferable, 2-(2-aminoethoxy)ethanol, 2-(2-aminoethylamino)ethanol, or 2,2'-oxybis(ethylamine) is more preferable, and 2-(2-aminoethylamino)ethanol or 2,2'-oxybis(ethylamine) is still more preferable.

One kind of the component A may be used alone, or two or more kinds thereof may be used in combination.

The content of the component A is preferably 0.01% to 10% by mass, more preferably 0.03% to 5% by mass, and still more preferably 0.1% to 1% by mass, with respect to the total mass of the washing solution.

In the present washing solution, the mass ratio of the content of the hydroxylamine compound to the content of the component A (content of hydroxylamine compound/content of component A) is 5 to 200. Although the detailed mechanism is unknown, in a case where the ratio between the content of the hydroxylamine compound and the content of the component A is within the above-described range, it is possible to improve the dissolution suppressing performance with respect to the W-containing layer while maintaining the excellent washing performance of the dry etching residue.

From the above-described viewpoint, the mass ratio of the content of the hydroxylamine compound to the content of the component A (content of hydroxylamine compound/content of component A) is preferably 3 to 100 and more preferably 5 to 60.

[Water]

The present washing solution contains water.

The water is not particularly limited, and distilled water, deionized water, or pure water (ultrapure water) can be used. Pure water is preferable from the viewpoint that it contains almost no impurities and has less influence on a semiconductor substrate in a manufacturing step of the semiconductor substrate.

The pure water is preferably deionized water (DIW) in which inorganic anions, metal ions, and the like are reduced is preferable, and it is more preferably pure water in which the concentration of ions derived from metal atoms of Fe, Co, Na, K, Ca, Cu, Mg, Mn, Li, Al, Cr, Ni, and Zn is reduced. Among the above, in a case of being used in the preparation of the washing solution, it is preferable that the concentration of ions derived from metal atoms in water is on the order of ppt or less (in one form, the metal content is less than 0.001 ppt by mass).

The method of adjusting the contents of inorganic anions and metal ions is preferably, purification using a filtration membrane or an ion-exchange membrane or purification by distillation. Examples of the method of carrying out the adjustment include the method described in paragraphs [0074] to [0084] of JP2011-110515A and the method described in JP2007-254168A.

The content of water is not particularly limited; however, it is, for example, 1% to 95% by mass, preferably 10% to 90% by mass, and more preferably 30% to 85% by mass, with respect to the total mass of the washing solution.

The water that is used in the embodiment of the present invention is preferably the water prepared as described above. The above-described water is preferably used not only for the washing solution but also for washing the storage container, and it is also preferably used for a manufacturing step of the washing solution, measurement of components of the washing solution, and measurement for evaluation of the washing solution.

[Optional Component]

The washing solution may further contain a component other than the above-described components. Hereinafter, optional components that may be contained in the washing solution will be described in detail.

<Alcohol>

The present washing solution preferably contains alcohol.

In the present specification, the alcohol is a compound having at least one hydroxy group, and it is intended to be a compound that is not included in the component A, the azole compound described later, and the alkanolamine described later.

Examples of the alcohol include a compound having a main chain skeleton including a chain-like or cyclic aliphatic hydrocarbon group and at least one hydroxy group bonded to the main chain skeleton. In the main chain skeleton of the alcohol, one or more methanediyl groups ($—CH_2—$) constituting a chain-like or cyclic aliphatic hydrocarbon group may be substituted with a heteroatom. Examples of the heteroatom include —O— and —S—.

The number of hydroxy groups (alcoholic hydroxy groups) contained in the alcohol is not particularly limited. That is, the alcohol may be a monoalcohol having one hydroxy group or may be a polyhydric alcohol having two or more hydroxy groups.

From the viewpoint that the dissolution suppressing performance with respect to a metal layer (particularly, a TiN-containing layer) is more excellent, the alcohol is preferably a polyhydric alcohol, and among the above, it is more preferably a polyhydric alcohol having two or three hydroxy groups and still more preferably a polyhydric alcohol having two hydroxy groups.

The number of carbon atoms of the alcohol is not particularly limited; however, it is preferably 1 to 10, more preferably 2 to 8, and still more preferably 3 to 6.

Preferred examples of the polyhydric alcohols include a compound represented by Formula (2).

$$HO—C(R^1)_2—C(R^2)_2—C(R^3)_2—OH \quad (2)$$

In Formula (2), $R^1$, $R^2$, and $R^3$ represent a hydrogen atom, a hydroxy group, or an alkyl group which may have a hydroxy group. However, a plurality of $R^1$'s, a plurality of $R^2$'s, and a plurality of $R^3$'s may be respectively the same or different from each other.

$R^1$ and $R^3$ are a hydrogen atom, a hydroxy group, or an unsubstituted alkyl group having 1 to 3 carbon atoms, more preferably a hydrogen atom, a methyl group, or an ethyl group, and still more preferably a hydrogen atom or a methyl group.

$R^2$ is a hydrogen atom, a hydroxy group, or an unsubstituted alkyl group having 1 to 3 carbon atoms, more preferably a hydrogen atom, a hydroxy group, or a methyl group, and still more preferably a hydrogen atom or a methyl group.

The combination of $R^1$, $R^2$, and $R^3$ in Formula (2) is preferably a combination in which one to three of $R^1$, $R^2$, and $R^3$ are unsubstituted alkyl groups (more preferably methyl groups) having 1 to 3 carbon atoms, zero or one of $R^1$, $R^2$, and $R^3$ is a hydroxy group, and the remaining one is a hydrogen atom.

Specific examples of the compound included in the alcohol are shown below.

Among the polyhydric alcohols, examples of the compound represented by Formula (2) include 1,3-propanediol, 1,3-butanediol, 2-methyl-1,3-propanediol, 2,4-pentanediol, 2,2-dimethyl-1,3-propanediol, hexylene glycol (2-methyl-2,4-pentanediol), and glycerol.

Examples of the polyhydric alcohol other than the compound represented by Formula (2) include ethylene glycol, propylene glycol, 1,4-butanediol, 1,2-butanediol, 2,3-butanediol, pinacol, 1,3-cyclopentanediol, diethylene glycol, triethylene glycol, and tetraethylene glycol.

Examples of the monoalcohol include monoalcohol of which the main chain structure consists of an aliphatic hydrocarbon group, such as methanol, ethanol, 1-propanol, 2-propanol (isopropanol), 1-butanol, 2-butanol, isobutyl alcohol, tert-butyl alcohol, 2-pentanol, t-pentyl alcohol, 1-hexanol, allyl alcohol, propargyl alcohol, 2-butenyl alcohol, 3-butenyl alcohol, 4-pentene-2-ol, cyclopentanol, cyclohexanol, and tetrahydrofurfuryl alcohol; and monoalcohol of which the main chain structure has an ether group (—O—), such as an ethylene glycol monoalkyl ether (for example, 2-ethoxyethanol), a diethylene glycol monoalkyl ether, a triethylene glycol monoalkyl ether, 1-methoxy-2-propanol, 2-methoxy-1-propanol, 1-ethoxy-2-propanol, 2-ethoxy-1-propanol, propylene glycol mono-n-propyl ether, a dipropylene glycol monoalkyl ether, a tripropylene glycol monoalkyl ether, ethylene glycol monobenzyl ether, and diethylene glycol monobenzyl ether.

The alcohol is still more preferably 1,3-propanediol, 1,3-butanediol, 2-methyl-1,3-propanediol, glycerol, 2,4-pentanediol, 2,2-dimethyl-1,3-propanediol, or hexylene glycol, and particularly preferably 1,3-butanediol, 2,4-pentanediol, or hexylene glycol, and it is most preferably hexylene glycol from the viewpoint that the effect of the present invention is more excellent.

One kind of the alcohol may be used alone, or two or more kinds thereof may be used in combination. From the viewpoint that the effect of the present invention is more excellent, the washing solution preferably contains two or more kinds of compounds represented by Formula (2).

The content of alcohol is not particularly limited, and it is, for example, 1% to 90% by mass, preferably 3% to 80% by mass, and more preferably 4% to 70% by mass, with respect to the total mass of the washing solution.

<Azole Compound>

The present washing solution may contain an azole compound.

The azole compound is a compound having an aromatic hetero 5-membered ring that contains at least one nitrogen atom.

The number of nitrogen atoms contained in the hetero 5-membered ring of the azole compound is not particularly limited and is preferably 1 to 4, and more preferably 2 to 4.

The azole compound may have a substituent on the hetero 5-membered ring. Examples of such a substituent include a hydroxy group, a carboxy group, a mercapto group, an amino group, and a substituted or unsubstituted hydrocarbon group. In addition, in a case where two substituents are adjacent to each other on the hetero 5-membered ring, the two substituents may be bonded to each other to form a ring.

Examples of the hydrocarbon group contained in the hetero 5-membered ring as a substituent include an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms and more preferably having 2 to 6 carbon atoms), an alkynyl group (preferably having 2 to 12 carbon atoms and more preferably having 2 to 6 carbon atoms), an aryl group (preferably having 6 to 18 carbon atoms and more preferably having 6 to 10 carbon atoms), and an aralkyl group (preferably having 7 to 23 carbon atoms and more preferably having 7 to 11 carbon atoms).

Examples of the substituent contained in the above-described hydrocarbon group include a hydroxy group, a carboxy group, and —N($R_a$)($R_b$). $R_a$ and $R_b$ each independently represent a hydrogen atom, an alkyl group (preferably having 1 to 6 carbon atoms and more preferably having 1 to 4 carbon atoms), or a hydroxyalkyl group (preferably having 1 to 6 carbon atoms and more preferably having 1 to 4 carbon atoms).

The ring that is formed by bonding two adjacent substituents on the hetero 5-membered ring to each other is not particularly limited; however, it is preferably an aromatic ring (may be either a monocyclic ring or a polycyclic ring) and more preferably a benzene ring. The above-described ring that is formed by bonding two substituents to each other may have a substituent.

The substituent is not particularly limited. However, examples thereof include those exemplified as the substituent of the hydrocarbon group contained in the hetero 5-membered ring.

Examples of the azole compound include an imidazole compound in which one of the atoms constituting the azole ring is a nitrogen atom, a pyrazole compound in which two of the atoms constituting an azole ring are nitrogen atoms, a thiazole compound in which one of the atoms constituting an azole ring is a nitrogen atom and the other is a sulfur atom, a triazole compound in which three of the atoms constituting an azole ring are nitrogen atoms, and a tetrazole compound in which four of the atoms constituting an azole ring are nitrogen atoms.

Examples of the imidazole compound include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazole carboxylic acid, histamine, and benzoimidazole.

Examples of the pyrazole compound include pyrazole, 4-pyrazolecarboxylic acid, 1-methylpyrazole, 3-methylpyrazole, 3-amino-5-hydroxypyrazole, 3-aminopyrazole, and 4-aminopyrazole.

Examples of the thiazole compound include 2,4-dimethylthiazole, benzothiazole, and 2-mercaptobenzothiazole.

Examples of the triazole compound include a compound having a benzotriazole skeleton obtained by bonding two adjacent substituents on a triazole ring to each other to form a benzene ring.

Examples of the compound having a benzotriazole skeleton include 1H-benzotriazole, 2H-benzotriazole, and a compound obtained by substituting a benzene ring of 1H-benzotriazole or 2H-benzotriazole, and/or a triazole ring, with at least one substituent selected from the group consisting of an alkyl group (preferably having 1 to 8 carbon atoms), an amino group, a hydroxy group, a carboxy group, a halogen atom, an aryl group, and a group consisting of a combination these groups.

More specific examples thereof include 1H-benzotriazole, 2H-benzotriazole, 5-methyl-1H-benzotriazole (CAS registration number: 136-85-6), tolyltriazole (CAS registration number: 29385-43-1), 5-aminobenzotriazole, 1-hydroxybenzotriazole, carboxybenzotriazole (for example, benzotriazole-5-carboxylic acid or 4-carboxybenzotriazole), 5,6-dimethylbenzoatriazole, 1-[N,N-bis(hydroxyethyl)aminoethyl]benzotriazole, 1-(1,2-dicarboxyethyl)benzotriazole, 1-[N,N-bis(2-ethylhexyl)aminomethyl]benzotriazole, 1-[N,N-bis(2-ethylhexyl)aminomethyl]methylbenzotriazole, and 2,2'-{[(4-methyl-1H-benzotriazole-1-yl)methyl]imino}bisethanol (product name: "IRGAMET 42", manufactured by BASF SE).

Examples of the triazole compound other than the compound having a benzotriazole skeleton include 1,2,4-triazole, 3-methyl-1,2,4-triazole, 3-amino-1,2,4-triazole, 1,2,3-triazole, and 1-methyl-1,2,3-triazole.

Examples of the tetrazole compound include an unsubstituted tetrazole and a tetrazole having, as a substituent, a hydroxy group, a carboxy group, or a substituted or unsubstituted amino group. Here, the substituent in a case where the amino group is substituted is preferably an alkyl group having 1 to 6 carbon atoms and more preferably an alkyl group having 1 to 3 carbon atoms.

More specific examples of the tetrazole compound include 1H-tetrazole (1,2,3,4-tetrazole), 5-methyl-1H-tetrazole, 5-amino-1H-tetrazole, 1,5-pentamethylenetetrazole, 1-phenyl-5-mercaptotetrazole, and 1-(2-dimethylaminoethyl)-5-mercaptotetrazole.

The azole compound is preferably a triazole compound or a tetrazole compound, more preferably at least one selected from the group consisting of 1,2,4-triazole, 1,2,3-triazole, 1H-tetrazole, 5-aminotetrazole, 1H-benzotriazole, tolyltriazole, 5-methyl-1H-benzotriazole, carboxybenzotriazole, and 2,2'-[{(4-methyl-1H-benzotriazole-1-yl)methyl}imino]bisethanol, and still more preferably 1H-tetrazole, 1H-benzotriazole, tolyltriazole, 5-methyltriazole, or 2,2'-[{(4-methyl-1H-benzotriazole-1-yl)methyl}imino]bisethanol.

It is noted that in the present specification, the above-described azole compound is intended to include a tautomer thereof.

One kind of the azole compound may be used alone, or two or more kinds thereof may be used in combination.

The content of the azole compound is preferably 0.01% to 10% by mass, more preferably 0.05% to 5% by mass, and still more preferably 0.1% to 3% by mass, with respect to the total mass of the washing solution.

<Basic Compound>

The washing solution may contain a basic compound.

The basic compound is intended to be a compound, where the pH of a solution of the compound exceeds 7 in a case of being dissolved in water. The basic compound has a function as a pH adjusting agent for adjusting the pH of the washing solution.

The basic compound is not particularly limited, and examples thereof include a quaternary ammonium compound, an ammonium hydroxide compound, and an amine compound (however, the compounds included in the component A and the azole compound are excluded), a quaternary ammonium compound, an ammonium hydroxide compound, and an amine compound (however, the compounds included in the component A and the azole compound are excluded).

(Quaternary Ammonium Compound)

The washing solution may include a quaternary ammonium compound which is a compound having one quaternary ammonium cation or a salt thereof in the molecule.

The quaternary ammonium compound is not particularly limited as long as it is a compound having one quaternary ammonium cation in which the nitrogen atom is substituted with four hydrocarbon groups (preferably an alkyl group), or a salt thereof.

Examples of the quaternary ammonium compound include a quaternary ammonium hydroxide, a quaternary ammonium fluoride, a quaternary ammonium bromide, a quaternary ammonium iodide, a quaternary ammonium acetate, and a quaternary ammonium carbonate.

Among them, the washing solution preferably contains a quaternary ammonium hydroxide from the viewpoint that the effect of the present invention is more excellent, where a compound represented by Formula (a1) is more preferable.

(a1)

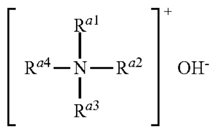

In Formula (a1), $R^{a1}$ to $R^{a4}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{a1}$ to $R^{a4}$ may be bonded to each other to form a cyclic structure.

The alkyl group may be either linear, branched, or cyclic.

In the quaternary ammonium hydroxide, it is preferable that at least one of the four hydrocarbon groups that are substituted in a quaternary ammonium cation is a hydrocarbon group having two or more carbon atoms from the viewpoint that the Co anticorrosion properties are more excellent.

That is, it is preferable that $R^{a1}$ to $R^{a4}$ in Formula (a1) each independently represent an alkyl group having 2 to 16 carbon atoms, an aryl group having 6 to 16 carbon atoms, an aralkyl group having 7 to 16 carbon atoms, or a hydroxyalkyl group having 1 to 16 carbon atoms, or at least two of $R^{a1}$ to $R^{a4}$ are bonded to each other to form a cyclic structure.

Examples of the compound represented by Formula (a1) include tetramethylammonium hydroxide (TMAH), tetraethylammonium hydroxide (TEAH), tetrapropylammonium hydroxide, tetrabutylammonium hydroxide (TBAH), methyltripropylammonium hydroxide, methyltributylammonium hydroxide, ethyltrimethylammonium hydroxide, methyltriethylammonium hydroxide, dimethyldiethylammonium hydroxide, benzyltrimethylammonium hydroxide (BzTMAH), hexadecyltrimethylammonium hydroxide, (2-hydroxyethyl)trimethylammonium, and spiro-(1,1')-bipyrrolidinium hydroxide.

Among them, TEAH, tetrapropylammonium hydroxide, TBAH, methyltripropylammonium hydroxide, methyltributylammonium hydroxide, ethyltrimethylammonium hydroxide, dimethyldiethylammonium hydroxide, BzTMAH, hexadecyltrimethylammonium hydroxide, (2-hydroxyethyl)trimethylammonium hydroxide, or spiro-(1,1')-bipyrrolidinium hydroxide is preferable.

One kind of the quaternary ammonium compound may be used alone, or two or more kinds thereof may be used in combination.

In a case where the washing solution contains a quaternary ammonium compound, the content of the quaternary ammonium compound is preferably 0.010% to 30% by mass and more preferably 0.10% to 20% by mass with respect to the total mass of the washing solution.

(Ammonium Hydroxide)

The washing solution may contain ammonium hydroxide ($NH_4OH$) as the basic compound.

In a case where the washing solution contains ammonium hydroxide, the content of the ammonium hydroxide is not particularly limited; however, it is preferably 0.01% to 10% by mass and more preferably 0.05% to 5.0% by mass with respect to the total mass of the washing solution.

(Amine Compound)

In the present specification, the amine compound is intended to be a compound having an amino group in the molecule, where the compound is not included in any of the component A and the azole compound.

Examples of the amine compound include a primary amine having a primary amino group ($-NH_2$) in the molecule, a secondary amine having a secondary amino group (>NH) in the molecule, a tertiary amine having a tertiary amino group (>N—) in the molecule, and a salt thereof.

Examples of the salt of the amine compound include a salt of an inorganic acid, in which at least one non-metal selected from the group consisting of Cl, S, N, and P is bonded to hydrogen, where a hydrochloride, a sulfate, or a nitrate is preferable.

In addition, the amine compound is preferably a water-soluble amine, where an amount of 50 g or more of the amine compound can be dissolved in 1 L of water.

Examples of the amine compound include an alicyclic amine compound, an alkanolamine other than the component A, and another amine compound other than these compounds.

The alicyclic amine compound is intended to be a compound having an alicyclic ring (non-aromatic ring) structure in the molecule among the amine compounds.

Examples of the alicyclic amine compound include 1,8-diazabicyclo[5.4.0]-7-undecene (DBU), ε-caprolactam, the following compound 1, the following compound 2, the following compound 3, 1,4-diazabicyclo[2.2.2]octane (DABCO), tetrahydrofurfurylamine, N-(2-aminoethyl)piperazine, hydroxyethylpiperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4,3,0]-5-nonene.

Compound 1

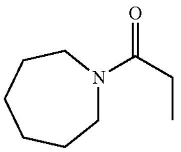

Compound 2

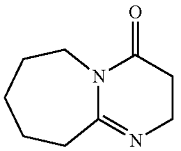

Compound 3

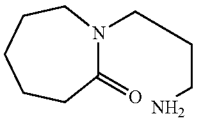

The alkanolamine is an amine compound other than the component A, which has at least one amino group in the molecule and at least one hydroxy group (preferably a hydroxylalkyl group).

Hereinafter, the notation of simply "alkanolamine" is intended to be an alkanolamine that does not correspond to the component A.

Examples of the alkanolamine include a compound having a main chain skeleton consisting of a chain-like aliphatic hydrocarbon group, at least one amino group bonded to the main chain skeleton, and at least one alcoholic hydroxyl group bonded to the main chain skeleton. It is noted that in the main chain skeleton, one or more methanediyl groups (—$CH_2$—) constituting a chain-like aliphatic hydrocarbon group may be substituted with a heteroatom. Examples of the heteroatom include —O—, —S—, and —NH—, where —O— or —NH— is preferable.

The number of amino groups contained in the alkanolamine is, for example, 1 to 5, and it is preferably 1 to 3, more preferably 1 or 2, and still more preferably 1.

The amino group contained in the alkanolamine may be any of a primary amino group (—$NH_2$), a secondary amino group (>NH), or a tertiary amino group (>N—). However, it is preferable that the alkanolamine has at least one selected from the group consisting of a primary amino group and a secondary amino group, and it is more preferable that any amino group contained in the alkanolamine is a primary amino group or a secondary amino group.

The number of hydroxy groups contained in the amino alcohol is, for example, 1 to 5, and it is preferably 1 to 3 and more preferably 1 or 2.

Examples of the alkanolamine include monoethanolamine (MEA), diethanolamine (DEA), triethanolamine (TEA), diethylene glycolamine (DEGA), trishydroxymethylaminomethane (Tris), N,N-dimethylethanolamine, N,N-diethylethanolamine, N-methyldiethanolamine, N-ethyldiethanolamine, N-methylethanolamine, 2-amino-2-methyl-1-propanol, 2-amino-2-methyl-1,3-dipropanol, 2-amino-2-ethyl-1,3-dipropanol, and 2-(methylamino)-2-methyl-1-propanol.

Among the amine compounds, examples of the primary amine other than the component A, the alicyclic amine compound, and the alkanolamine include methylamine, ethylamine, ethylenediamine, propylamine, propylenediamine, butylamine, pentylamine, methoxyethylamine, and methoxypropylamine.

Examples of the secondary amine other than the component A, the alicyclic amine compound, and the alkanolamine include dimethylamine, diethylamine, dipropylamine, and dibutylamine (DBA).

Examples of the tertiary amine other than the component A, the alicyclic amine compound, and the alkanolamine include trimethylamine, triethylamine, and tributylamine (TBA).

—Component C—

From the viewpoint that the effect of the present invention is more excellent, the washing solution preferably contains a component C which is at least one selected from the group consisting of ethylenediamine and 2-aminoethanol.

The content of the component C in the washing solution is not particularly limited; however, in a case where the washing solution contains one kind of the component C, the content thereof is preferably 20% by mass or less and more preferably 5% by mass or less with respect to the total mass of the washing solution. The lower limit thereof is not particularly limited; however, it is preferably 0.00001% by mass or more and more preferably 0.001% by mass or more with respect to the total mass of the washing solution.

In a case where the washing solution contains two or more kinds of components C, the content of each of the components C with respect to the total mass of the washing solution is preferably 10% by mass or less and more preferably 2.5% by mass or less. The lower limit thereof is not particularly limited; however, the content of each of the components C with respect to the total mass of the washing solution is preferably 0.00001% by mass or more and more preferably 0.001% by mass or more.

As the component C, only one of ethylenediamine and 2-aminoethanol may be used, or both of them may be used in combination.

The total content of the components C in the washing solution is not particularly limited; however, it is preferably 0.0001% to 20% by mass and more preferably 0.001% to 5% by mass.

One kind of the amine compound may be used alone, or two or more kinds thereof may be used in combination.

In a case where the washing solution contains an amine compound, the content thereof is not particularly limited; however, it is preferably 0.010% to 30% by mass and more preferably 0.10% to 20% by mass with respect to the total mass of the washing solution.

One kind of the basic compound may be used alone, or two or more kinds thereof may be used in combination.

In a case where the washing solution contains a basic compound, the content of the basic compound is preferably 0.01% to 30% by mass and more preferably 0.10% to 20% by mass with respect to the total mass of the washing solution.

<Acidic Compound>

The washing solution may contain an acidic compound as a pH adjusting agent.

The acidic compound may be an inorganic acid or may be an organic acid (however, chelating agent described later is excluded).

Examples of the inorganic acid include sulfuric acid, hydrochloric acid, acetic acid, nitric acid, and phosphoric acid, where sulfuric acid, hydrochloric acid, or acetic acid is preferable. Examples of the organic acid include lower (1 to 4 carbon atoms) aliphatic monocarboxylic acids such as formic acid, acetic acid, propionic acid, and butyric acid. In addition, the chelating agent described later may also serve as an acidic compound.

One kind of the acidic compound may be used alone, or two or more kinds thereof may be used in combination.

The kind and content of the acidic compound may be adjusted by appropriately selecting the kind and adjusting the content so that the pH of the washing solution is within a range described later.

<Component B>

From the viewpoint that the effect of the present invention is more excellent, the washing solution preferably contains a component B that is at least one kind selected from the group consisting of isobutene, (E)-2-methyl-1,3-pentadiene, 4-methyl-1,3-pentadiene, 2,2,4-trimethyloxetane, 4-methyl-3-pentene-2-ol, and 2,4,4,6-tetramethyl-1,3-dioxane.

From the viewpoint that the effect of the present invention is still more excellent, the component B is preferably at least one kind selected from the group consisting of (E)-2-methyl-1,3-pentadiene, 4-methyl-1,3-pentadiene, 2,2,4-trimethyloxetane, 4-methyl-3-pentene-2-ol, and 2,4,4,6-tetramethyl-1,3-dioxane.

The content of the component B in the washing solution is not particularly limited; however, in a case where the washing solution contains one kind of the component B, the content thereof is preferably 0.5% by mass or less, more preferably 0.10% by mass or less, and still more preferably 0.05% by mass or less, with respect to the total mass of the washing solution. The lower limit thereof is not particularly limited; however, it is preferably 0.0001% by mass or more, more preferably 0.0005% by mass or more, and still more preferably 0.001% by mass or more, with respect to the total mass of the washing solution.

In a case where the washing solution contains two or more kinds of components B, the content of each of the components B with respect to the total mass of the washing solution is preferably 0.5% by mass or less, more preferably 0.1% by mass or less, and still more preferably 0.05% by mass or less. The lower limit thereof is not particularly limited; however, the content of each of the components B with respect to the total mass of the washing solution is preferably 0.0001% by mass or more, more preferably 0.0005% by mass or more, and still more preferably 0.001% by mass or more.

One kind of the component B may be used alone, or two or more kinds thereof may be used in combination.

The total content of the component B in the washing solution is not particularly limited; however, it is preferably 0.0001% to 1% by mass, more preferably 0.0005% to 0.2% by mass, and still more preferably 0.001% to 0.1% by mass.

<Organic Solvent>

The washing solution may contain an organic solvent other than the above components.

The organic solvent is preferably a hydrophilic organic solvent. In the present specification, the hydrophilic organic solvent is intended to be an organic solvent, where an amount of 0.1 g or more of the organic solvent is dissolved in 100 g of water under a condition of 25° C. The hydrophilic organic solvent is preferably an organic solvent that can be uniformly mixed with water at any mixing ratio.

Examples of the hydrophilic organic solvent other than the above-described components include an amide-based solvent, a sulfur-containing solvent, and a ketone-based solvent.

Examples of the amide-based solvent include N,N-dimethylformamide, 1-methyl-2-pyrrolidone, 2-pyrrolidinone, 1,3-dimethyl-2-imidazolidinone, formamide, N-methylformamide, acetamide, N-methylacetamide, N,N-dimethylacetamide, N-methylpropanamide, and hexamethylphosphoric triamide.

Examples of the sulfur-containing solvent include dimethyl sulfone, dimethyl sulfoxide, and sulfolane.

Examples of the ketone-based solvent include acetone, methyl ethyl ketone, methyl isobutyl ketone, and cyclohexanone.

One kind of the above-described organic solvent may be used alone, or two or more kinds thereof may be used in combination.

In a case where the washing solution contains an organic solvent, the content of the organic solvent is preferably 0.001% to 20% by mass and more preferably 0.01% to 10% by mass with respect to the total mass of the washing solution.

<Chelating Agent>

The treatment liquid may contain a chelating agent.

The chelating agent is a compound having a function of chelating with a metal element, and as a result of the chelation, it has a function of removing residues such as an etching residue and an ashing residue.

Examples of the chelating agent include a polyamino polycarboxylic acid and a polycarboxylic acid.

The polyamino polycarboxylic acid is a compound having a plurality of amino groups and a plurality of carboxy groups in one molecule, and examples thereof include a mono or polyalkylene polyamine polycarboxylic acid, a polyaminoalkane polycarboxylic acid, a poly aminoalkanol polycarboxylic acid, and a hydroxyalkyl ether polyamine polycarboxylic acid.

More specific examples of the polyamino polycarboxylic acid include butylenediaminetetraacetic acid, diethylenetriaminepentaacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid (Cy-DTA), ethylenediaminediacetic acid, ethylenediaminedipropionic acid, 1,6-hexamethylene-diamine-N,N,N',N'-tetraacetic acid, N,N-bis(2-hydroxybenzyl) ethylenediamine-N,N-diacetic acid, diaminopropanetetraacetic acid, 1,4,7,10-tetraazacyclododecane-tetraacetic acid, diaminopropanoltetraacetic acid, and (hydroxyethyl)ethylenediaminetriacetic acid.

The polycarboxylic acid is a compound having a plurality of carboxylic acid groups in one molecule. However, the above-described polyamino polycarboxylic acid is not included in the polycarboxylic acid.

Examples of the polycarboxylic acid include citric acid, malonic acid, maleic acid, succinic acid, malic acid, and tartaric acid.

The washing solution may contain a chelating agent other than the above. Examples of the other chelating agent include at least one biguanide compound selected from the group consisting of a compound having a biguanide group and a salt thereof.

In addition, as a chelating agent, the chelating agent described in JP2017-504190A can also be used, and the content described in this document is incorporated in the present specification.

One kind of the chelating agent may be used alone, or two or more kinds thereof may be used in combination.

In a case where the washing solution contains a chelating agent, the content of the chelating agent is preferably 0.010% to 10% by mass with respect to the total mass of the washing solution.

<Fluorine-Containing Compound>

The washing solution may contain a fluorine-containing compound.

Examples of the fluorine-containing compound include hydrofluoric acid (fluorinated acid), ammonium fluoride, tetramethylammonium fluoride, and tetrabutylammonium fluoride, where hydrofluoric acid is preferable.

One kind of the fluorine-containing compound may be used alone, or two or more kinds thereof may be used in combination.

In a case where the washing solution contains a fluorine-containing compound, the content thereof is preferably 0.01 to 5.0% by mass with respect to the total mass of the washing solution.

<Metal Component>

The washing solution may contain a metal component.

Examples of the metal component include metal particles and metal ions. For example, in a case of being referred to as the content of the metal component, it indicates the total content of metal particles and metal ions. The washing solution may contain either metal particles or metal ions, or it may contain both metal particles and metal ions.

Examples of the metal atom contained in the metal component include an metal atom selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one kind of metal atom or two or more kinds thereof.

The metal particle may be a single body or an alloy or may be present in a form in which the metal is associated with an organic substance.

The metal component may be a metal component unavoidably contained in each component (raw material) contained in the washing solution or may be a metal component unavoidably contained during the production, storage, and/or transfer of the washing solution, and it may be added intentionally.

In a case where the washing solution contains a metal component, the content of the metal component is 0.01 ppt by mass to 10 ppm by mass with respect to the total mass of the washing solution in a large number of cases, and it is preferably 0.1 ppt by mass to 1 ppm by mass and more preferably 0.1 ppt by mass to 100 ppb by mass.

The kind and content of the metal component in the washing solution can be measured by an inductively coupled plasma mass spectrometry (ICP-MS).

In the ICP-MS method, the content of the metal component to be measured is measured regardless of the existence form thereof. As a result, the total mass of metal particles to be measured and metal ions is quantified as the content of the metal component.

Regarding the measurement with the ICP-MS method, it is possible to use an Agilent 8800 triple quadrupole ICP-MS (inductively coupled plasma mass spectrometry, for semiconductor analysis, option #200) and Agilent 8900, manufactured by Agilent Technologies, Inc., and NexION 350S manufactured by PerkinElmer, Inc.

The method of adjusting the content of each metal component in the washing solution is not particularly limited. For example, the content of the metal component in the washing solution can be reduced by carrying out a known treatment of removing a metal from the washing solution and/or from a raw material containing each component that is used in the preparation of the washing solution. In addition, the content of the metal component in the washing solution can be increased by adding a compound containing metal ions to the washing solution.

<Anticorrosive Agent>

The washing solution may include an anticorrosive agent.

The anticorrosive agent has a function of preventing corrosion of a metal layer due to over-etching or the like, by coordinating and forming a film on the surface of the metal layer (particularly, the W-containing layer or the Co-containing layer) serving as a wiring line of a semiconductor device.

It is noted that in the present specification, the above-described azole compound and chelating agent (compound having chelating ability) are not included in the anticorrosive agent.

Examples of the anticorrosive agent include tritolyl phosphate, adenine, cytosine, guanine, thymine, a phosphate inhibitor, propanethiol, silanes, benzohydroxamic acids, a heterocyclic nitrogen inhibitor, ascorbic acid, thiourea, 1,1,3,3-tetramethylurea, urea, urea derivatives, uric acid, potassium ethylxanthogenate, glycine, dodecylphosphonic acid, iminodiacetic acid, boric acid, nitrilotriacetic acid, 2,3,5-trimethylpyrazine, 2-ethyl-3,5-dimethylpyrazine, quinoxaline, acetylpyrrole, pyridazine, histadine, pyrazine, glutathione (reduced form), cysteine, cystine, thiophene, mercaptopyridine N-oxide, thiamine HCl, tetraethylthiuram disulfide, ascorbic acid, catechol, t-butylcatechol, phenol, and pyrogallol.

Examples of the anticorrosive agent include a compound represented by Formula (A) and a compound represented by Formula (B).

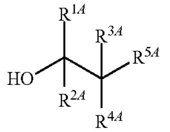

(A)

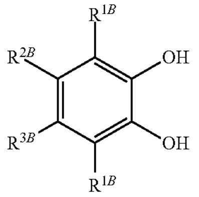

(B)

In Formula (A), $R^{1A}$ to $R^{5A}$ each independently represent a hydrogen atom, a substituted or unsubstituted hydrocarbon group, a hydroxy group, a carboxy group, or a substituted or unsubstituted amino group. However, a structure of Formula (A) includes at least one group selected from the hydroxy group, the carboxy group, or the substituted or unsubstituted amino group, In Formula (B), $R^{1B}$ to $R^{4B}$ each independently represent a hydrogen atom or a substituted or unsubstituted hydrocarbon group.

Examples of the compound represented by Formula (A) include 1-thioglycerol, L-cysteine, and thiomaleic acid.

Examples of the compound represented by Formula (B) include catechol and t-butyl catechol.

One kind of anticorrosive agent may be used alone, or two or more kinds thereof may be used in combination.

In a case where the washing solution contains an anticorrosive agent, the content of the anticorrosive agent in the washing solution is preferably 0.01% to 5% by mass, more preferably 0.05% to 5% by mass, and still more preferably 0.1% to 3% by mass with respect to the total mass of the washing solution.

As the anticorrosive agent, an anticorrosive agent of a high-purity grade is preferably used, which is more preferably used by being further purified.

The method of purifying the anticorrosive agent is not particularly limited. However, for example, a known method such as filtration, ion exchange, distillation, adsorption purification, recrystallization, reprecipitation, sublimation, or purification using a column is used, and this method can be also applied in combination.

The washing solution may contain an additive other than the above components.

Examples of the additive include a surfactant, an antifoaming agent, a rust inhibitor, and a preservative.

[Physical Properties of Washing Solution]

<pH>

From the viewpoint that the excellent washing performance of the dry etching residue is stably exhibited, the pH of the present washing solution is preferably 7 or more.

From the above viewpoint, the pH of the washing solution is more preferably 8 to 14, still more preferably 9 to 12, and particularly preferably 9 to 11.

The pH of the washing solution is a value obtained by carrying out the measurement at 25° C. using a known pH meter.

<Coarse Particle>

It is preferable that the washing solution is substantially free of coarse particles.

The coarse particles refer to particles having a diameter of 0.2 μm or more in a case where the shape of the particles is regarded as a sphere. In addition, a case of being substantially free of coarse particles refers to that ten or fewer particles of 0.2 μm or more are present in 1 mL of the washing solution in a case where the washing solution is subjected to measurement using a commercially available measuring device in the light scattering type in-liquid particle measuring method.

It is noted that the coarse particles contained in the washing solution are particles or the like of dirt, dust, organic solids, inorganic solids, and the like contained as impurities in raw materials, and particles of dirt, dust, and organic solids, and inorganic solids brought in as contaminants during the preparation of the washing solution, which correspond to the particles that are finally present as particles without being dissolved in the washing solution.

The amount of the coarse particles present in the washing solution can be measured in the liquid phase using a commercially available measuring device in a light scattering type in-liquid particle measuring method using a laser as a light source.

Examples of the method of removing coarse particles include a purification treatment such as filtering.

[Kit and Concentrated Solution]

The raw materials of the washing solution may be divided into a plurality of parts to be used as a kit for preparing the washing solution. Examples of the kit for preparing the washing solution include a kit (hereinafter, also described as a "kit A") including a first liquid containing at least a hydroxylamine compound and a second liquid containing at least the component A.

The first liquid of the kit A may contain a component other than the hydroxylamine compound; however, it preferably does not contain any of the component A, the azole compound, or the basic compound. In addition, the second liquid of the kit A may contain a component other than the component A; however, it preferably does not contain the hydroxylamine compound.

The content of each component contained in the first liquid and the second liquid provided in the kit is not particularly limited; however, the content of each component in the washing solution prepared by mixing the first liquid and the second liquid is preferably an amount corresponding to the preferred amount described above.

The pH of each of the first liquid and the second liquid provided in the kit is not particularly limited, and it suffices that the pH is adjusted so that the pH of the washing solution prepared by mixing the first liquid and the second liquid is included in the above-described range.

In addition, the washing solution may be prepared as a concentrated solution. In this case, it can be diluted with a diluent liquid at the time of use. The diluent liquid is not particularly limited; however, examples thereof include water, alcohol, the above-described organic solvent, and a diluent liquid consisting of a mixed liquid thereof. That is, the kit for preparing the washing solution may be a kit including the washing solution in the form of a concentrated solution and the diluent liquid.

[Use Application]

The present washing solution is a washing solution for a semiconductor device. In the present specification, "for a semiconductor device" means that it is used in the manufacture of a semiconductor device. The present washing solution can be used in any of the washing treatments included in the steps for manufacturing a semiconductor device, and it can be used, for example, in a washing treatment for removing an etching residue and an ashing residue, which are present on a semiconductor substrate (hereinafter, also simply referred to as a "substrate"). It is noted that in the present specification, the etching residue and the ashing residue are collectively referred to as residues. In addition, the present washing solution may be used in a washing treatment for removing residues such as metal impurities or fine particles from a substrate after chemical mechanical polishing. In particular, the present washing solution can be suitably used as a washing solution for removing residues that have adhered onto a metal layer (particularly, a Co-containing layer, a W-containing layer, or a TiN-containing layer).

In addition, the washing solution can be also used as a treatment liquid such as a pre-wet liquid to be applied on a substrate to improve the coatability of an actinic ray-sensitive or radiation-sensitive composition before the step of forming a resist film using the composition, a solution (for example, a removal liquid, a stripper, or the like) that is used for removing various resist films for pattern formation, or a solution (for example, a removal liquid, a stripper, or the like) that is used for removing a permanent film (for example, a color filter, a transparent insulating film, a lens made of a resin) from a semiconductor substrate, or the like. It is noted that since the semiconductor substrate after the removal of the permanent film may be used again for the manufacture of the semiconductor device, the removal of the permanent film is included in the manufacturing step of the semiconductor device.

In addition, the washing solution can also be used as an etchant for metal oxides such as cobalt oxide and copper oxide (including a metal oxide and a composite oxide consisting of a plurality of metal oxides).

The washing solution may be used in only one use application or two or more of use applications among the above-described use applications.

[Production Method for Washing Solution]

<Washing Solution Preparation Step>

The production method for the washing solution is not particularly limited, and a known production method can be applied. Examples of the production method for the above-described washing solution include a method having at least a washing solution preparation step of mixing the above-described components to prepare the washing solution.

In the washing solution preparation step, the order in which the respective components are mixed is not particularly limited. It is preferable that each of the liquids provided in the kit and the concentrated solution is also produced according to the same method as described above.

The method for producing the kit is not particularly limited. For example, after preparing the first liquid and the second liquid described above, the first liquid and the second liquid are respectively accommodated in containers different from each other to produce a kit for preparing the washing solution.

<Metal Removal Step>

Before being used in the washing solution preparation step, each component is preferable to be subjected to a metal removal step of removing a metal from a raw material containing each component to obtain a purified substance containing each component. In a case of subjecting each component to a metal removal step and preparing a washing solution using each component contained in the obtained purified substance, it is possible to further reduce the content of the metal component contained in the washing solution.

A method of removing a metal from a raw material (hereinafter, also referred to as a "purification target substance") containing each component is not particularly limited, and known methods such as a method of passing a purification target substance through at least one resin selected from the group consisting of a chelating resin and an ion exchange resin and a method of passing a purification target substance through a metal ion adsorption filter can be applied thereto.

The component to be the object of the metal removal step is not particularly limited as long as it is a component contained in the above-described washing solution (however, the metal component is excluded). In a case where the washing solution contains a chelating agent, the content of the metal component contained in a raw material containing the chelating agent tends to be large as compared with those of other components, and thus it is more preferable to prepare the washing solution by using a purified substance containing a chelating agent, which is obtained by subjecting a raw material containing a chelating agent to the metal removal step.

The purification target substance to be subjected to the metal removal step may contain a compound other than the purification object, where a solvent is preferably contained. Examples of the solvent include water and an organic solvent, where water is preferable.

The content of the purification object in the purification target substance can be appropriately adjusted according to the kind of the object and the specific metal removal treatment, and it may be, for example, 1% to 100% by mass with respect to the total mass of the purification target substance, where 10% to 50% by mass is preferable.

The method of passing a purification target substance through at least one resin selected from the group consisting of a chelating resin and an ion exchange resin is not particularly limited, however, examples thereof include a method of passing a purification target substance through a container filled with a chelating resin and/or an ion exchange resin.

The chelating resin and/or the ion exchange resin, through which the purification target substance is passed, may be used alone, or two or more kinds thereof may be used. In addition, the purification target substance may be passed twice or more times through the same chelating resin and/or ion exchange resin.

In the metal removal step, both the chelating resin and the ion exchange resin may be used. In that case, the chelating resin and the ion exchange resin may be used in a double bed or a mixed bed.

The container is not particularly limited as long as it can be filled with a chelating resin and/or an ion exchange resin and can pass a purification target substance through the chelating resin and/or the ion exchange resin, which the container filled, and examples thereof include a column, a cartridge, and a filling tower.

Examples of the ion exchange resin that is used in the metal removal step include a cation exchange resin and an anion exchange resin. The cation exchange resin may be used in a single bed, or the cation exchange resin and the anion exchange resin may be used in a double bed or a mixed bed.

As the cation exchange resin, a known cation exchange resin can be used, and examples thereof include a sulfonic acid type cation exchange resin and a carboxylic acid type cation exchange resin. The material of the cation exchange resin is not particularly limited; however, it is preferably a gel-type cation exchange resin.

As the cation exchange resin, a commercially available product can be used, examples of thereof include Amberlite (registered trade name, the same applies hereinafter) IR-124, Amberlite IR-120B, Amberlite IR-200CT, Orlite (registered trade name, the same applies hereinafter) DS-1, and, Orlite DS-4 (all manufactured by ORGANO CORPORATION); Duolite (registered trade name, the same applies hereinafter) C20J, Duolite C20LF, Duolite C255LFH, and Duolite C-433LF (all manufactured by Sumika Chemtex Co., Ltd.); DIAION (registered trade name, the same applies hereinafter) SK-110, DIAION SK1B, and DIAION SK1BH (all, manufactured by Mitsubishi Chemical Corporation); and Purolite (registered trade name, the same applies hereinafter) S957 and Purolite S985 (all manufactured by Purolite Co., Ltd.).

The chelating resin is not particularly limited as long as it is a resin that has a chelating group having a function of chelating with a metal.

Examples of the chelating group include an aminophosphonate group such as an iminodiacetate group, an iminopropionate group, or an aminomethylenephosphonate group ($—NH—CH_3—PO_3H_2$), a polyamine group, a glucamine group such as an N-methylglucamine group, an aminocarboxylate group, a dithiocarbamate group, a thiol group, an amidoxime group, and a pyridine group, where an iminodiacetate group or an aminophosphonate group is preferable, and an aminophosphonate group is more preferable.

These chelating groups may form a salt together with a counter ion; however, it preferably does not form a salt from the viewpoint that the metal content can be further reduced. That is, the chelating resin is preferably an H-type chelating resin. The H-type chelating resin is obtained by bringing a metal ion-type chelating resin such as an Na-type, a Ca-type, or an Mg-type into contact with a mineral acid.

The base substance of the chelating resin is not particularly limited, and examples thereof include a styrene-divinylbenzene copolymer and a styrene-ethylstyrene-divinylbenzene copolymer.

As the chelating resin, a commercially available product can be used, and examples thereof include Duolite ES371N, Duolite C467, Duolite C747UPS, SUMICHELATE (registered trade name, the same applies hereinafter) MC760, SUMICHELATE MC230, SUMICHELATE MC300, SUMICHELATE MC850, SUMICHELATE MC640, SUMICHELATE MC900, and SUMICHELATE MC960 (all manufactured by Sumika Chemtex Co., Ltd.); Purolite S106, Purolite S910, Purolite S914, Purolite S920, Purolite S930, Purolite S950, Purolite S957, and Purolite S985 (all manufactured by Purolite Co., Ltd.); and Orlite DS-21, Amberlite IRC748, and Amberlite IRC747 (all manufactured by ORGANO CORPORATION).

In a case where the washing solution contains a chelating agent, from the viewpoint that the content of the metal component in the washing solution can be further reduced, the metal removal step to which a raw material containing the chelating agent is subjected preferably includes a step of passing a purification target substance through at least one resin selected from the group consisting of a chelating resin and an ion exchange resin, and more preferably include a step of passing a purification target substance through a chelating resin. Among the above, from the viewpoint that the contents of Ca and/or Zn contained in the raw material containing the chelating agent can be further reduced, it is more preferable to include a step of passing a purification target substance through a chelating resin having an aminophosphonate group.

Examples of the commercially available products of the chelating resin having an aminophosphonate group include Duolite C467, Duolite C747UPS, SUMICHELATE MC960, Purolite S950, Orlite DS-21, and Amberlite IRC747, where Orlite DS-21 is preferable.

It is noted that Orlite DS-21 is an H-type chelating resin obtained by introducing an aminomethylphosphonate group as a chelating group into a base material consisting of a styrene-ethylstyrene-divinylbenzene copolymer, and it is commercially available in a state containing of 30% to 45% by mass of the chelating resin and 55% to 70% by mass of water.

The conditions for passing a purification target substance through the ion exchange resin are not particularly limited, and the conditions according to the known method may be adopted.

The space velocity (SV) at the time when a purification target substance passes while coming into contact with the ion exchange resin is preferably 1 to 20 and more preferably 1 to 10.

The temperature of a purification target substance that comes into contact with the ion exchange resin is preferably 10° C. to 40° C. and more preferably 15° C. to 30° C.

As the metal removal step of a purification target substance, the adsorption purification treatment step of a metal component using silicon carbide, described in WO2012/043496A, may be carried out, and this description is incorporated in the present specification.

In addition, as the metal removal step of a purification target substance, metal particles contained in the purification target substance may be removed by using a filter that is mentioned as a filter that is used in the filtration step described later.

The metal removed from the purification target substance by the metal removal step is not particularly limited, and examples thereof include metals such as Li, Na, Mg, Al, K, Ca, Cr, Mn, Fe, Ni, Zn, and Pb. In the purified substance obtained by the metal removal step, the above-described metal content is reduced as compared with the purification target substance.

The content of the metal in the purified substance is not particularly limited. However, for example, the ratio of the content of the metal component per each metal element to the content of the chelating agent in the purified substance containing the chelating agent is $1.0\times10^{-6}$ or less, more preferably $1.0\times10^{-7}$ or less, and still more preferably $1.0\times10^{-8}$ or less in terms of mass ratio.

In addition, in the purified substance containing a chelating agent, which has been obtained by the metal removal step, the ratio of the content of the Ca component to the content of the Na component is preferably 1.0 or more by mass (the content of the Ca component is preferably larger than the content of the Na component), more preferably 1.1 or more, and still more preferably 1.2 or more in terms of mass ratio. The upper limit thereof is not particularly limited; however, the ratio of the content of the Ca component to the content of the Na component is preferably 50 or less in terms of mass ratio.

It is noted that the kind and content of the metal in the purification target substance and the purified substance can be measured according to the method described as the measuring method for the kind and content of the metal component in the washing solution.

<Filtration Step>

It is preferable that the production method includes a filtration step of filtering a liquid in order to remove foreign matters, coarse particles, and the like from the liquid.

The filtration method is not particularly limited, and a known filtration method can be used. Among the above, filtering using a filter is preferable.

The filter that is used for filtering can be used without particular limitation as long as it is a filter that is conventionally used in the use application of filtering and the like. Examples of the material constituting the filter include a fluororesin such as polytetrafluoroethylene (PTFE), a polyamide-based resin such as nylon, a polyolefin-based resin (having a high density and an ultrahigh molecular weight) such as polyethylene or polypropylene (PP), and polyaryl sulfone. Among them, a polyamide-based resin, PTFE, polypropylene (including high-density polypropylene), and polyaryl sulfone are preferable.

In a case of using a filter formed from these materials, it is possible to more effectively remove foreign matters having high polarity, which are likely to cause defects, from the washing solution.

The lower limit value of the critical surface tension of the filter is preferably 70 mN/m or more, and the upper limit value thereof is preferably 95 mN/m or less. In particular, the critical surface tension of the filter is preferably 75 to 85 mN/m.

It is noted that the value of the critical surface tension is a nominal value of a manufacturer. In a case of using a filter having a critical surface tension in the above range, it is possible to more effectively remove foreign matters having high polarity, which are likely to cause defects, from the washing solution.

The pore diameter of the filter is preferably about 0.001 to 1.0 μm, more preferably about 0.02 to 0.5 μm, and still more preferably about 0.01 to 0.1 μm. In a case of setting the pore diameter of the filter within the above range, it is possible to reliably remove fine foreign matters contained in the washing solution while suppressing filtration clogging.

In a case of using a filter, different filters may be combined. In this case, filtering with a first filter may be carried out only once or may be carried out twice or more times. In a case where different filters are combined and filtering is carried out two or more times, the kinds of filters may be the same or different from each other; however, the kinds of filters are preferably different from each other. Typically, it is preferable that at least one of the pore diameter or the constitutional material is different between the first filter and the second filter.

It is preferable that the pore diameters of the second and subsequent filtering are equal to or smaller than the pore diameter of the first filtering. In addition, the first filters having different pore diameters within the above range may be combined. With regard to the pore diameters herein, reference can be made to nominal values of filter manufacturers. A commercial filter can be selected from various filters provided by, for example, Nihon Pall Ltd., Advantec Toyo Kaisha, Ltd., Nihon Entegris K. K. (formerly Nippon Microlith Co., Ltd.), and Kitz Micro Filter Corporation. In addition, the following filters can also be used: "P-nylon filter (pore diameter: 0.02 μm, critical surface tension: 77 mN/m)" made of polyamide (manufactured by Nihon Pall Ltd.); "PE clean filter (pore diameter: 0.02 μm)" made of high-density polyethylene (manufactured by Nihon Pall Ltd.); and "PE clean filter (pore diameter: 0.01 μm)" made of high-density polyethylene (manufactured by Nihon Pall Ltd.).

As a second filter, a filter formed of the same material as that of the first filter can be used. A filter having the same pore diameter as that of the first filter described above can be used. In a case where the second filter having a pore diameter smaller than that of the first filter is used, the ratio of the pore diameter of the second filter to the pore diameter of the first filter (the pore diameter of the second filter/the pore diameter of the first filter) is preferably 0.01 to 0.99, is more preferably 0.1 to 0.9, and is still more preferably 0.3 to 0.9. In a case of setting the pore diameter of the second filter within the above range, fine foreign matters mixed in the washing solution are more reliably removed.

For example, filtering with the first filter may be carried out with a mixed liquid containing a part of components of the washing solution, and after mixing the remaining components with the mixed liquid to prepare the washing solution, the second filtering may be carried out.

In addition, it is preferable that the filter to be used is treated before filtering the washing solution. The liquid that is used for this treatment is not particularly limited; however, it is preferably the washing solution, a concentrated solution, or a liquid containing components contained in the washing solution.

In a case of carrying out filtering, the upper limit value of the temperature during filtering is preferably room temperature (25° C.) or lower, more preferably 23° C. or lower, and still more preferably 20° C. or lower. The lower limit value of the temperature at the time of filtering is preferably 0° C. or higher, more preferably 5° C. or higher, and still more preferably 10° C. or higher.

In the filtering, particulate foreign matters and/or impurities can be removed. However, in a case where the filtering is carried out at the above temperature, the amount of the particulate foreign matters and/or impurities dissolved in the washing solution is reduced, and thus the filtering is carried out more efficiently.

<Destaticization Step>

The above-described production method may further include a destaticization step of destaticizing at least one selected from the group consisting of a washing solution, a concentrated solution, and a kit. A specific method for destaticization will be described later.

It is preferable that all the steps involved in the production method are carried out in a clean room. It is preferable that the clean room satisfies 14644-1 clean room standards. It is preferable that the clean room satisfies any one of the International Organization for Standardization (ISO) Class 1, ISO Class 2, ISO Class 3, or ISO Class 4, it is more preferable that the clean room satisfies ISO Class 1 or ISO Class 2, and it is still more preferable that the clean room satisfies ISO Class 1.

<Container>

The container that accommodates the above-described washing solution, concentrated solution, or kit is not particularly limited as long as the corrosiveness due to the liquid does not cause a problem, and a known container can be used.

The container is preferably a container for a use application in a semiconductor, which has high internal cleanliness and hardly causes elution of impurities.

Examples of the commercially available product of the container include "CLEAN BOTTLE" series manufactured by AICELLO CHEMICAL Co., Ltd. and "PURE BOTTLE" manufactured by KODAMA PLASTICS Co., Ltd. In addition, for the intended purpose of preventing the mixing (contamination) of raw materials and impurities into the chemical liquid, it is also preferable to use a multi-layer container in which an inner wall of the container has a six-layer structure consisting of six kinds of resins and a multi-layer container in which an inner wall of the container has a seven-layer structure consisting of six kinds of resins. Examples of these containers include a container described in JP2015-12335TA, which are not limited thereto.

The inner wall of the container is preferably formed of or coated with one or more resins selected from the group consisting of a polyethylene resin, a polypropylene resin, and a polyethylene-polypropylene resin, a resin different from these, and a metal such as stainless steel, HASTELLOY, INCONEL, or MONEL.

As the above-described different resin, a fluorine-based resin (a perfluororesin) can be preferably used. In this manner, by using a container in which an inner wall of the container is formed of a fluorine-based resin or coated with a fluororesin, the occurrence of a problem of elution of ethylene or propylene oligomers can be suppressed, as compared with a case of using a container in which an inner wall of the container is formed of or coated with a polyethylene resin, a polypropylene resin, or a polyethylene-polypropylene resin.

Specific examples of such a container having an inner wall include a FluoroPure PFA composite drum manufactured by Entegris Inc. In addition, it is also possible to use the containers described on page 4 of the pamphlet of JP1991-502677A (JP-H3-502677A), page 3 of the pamphlet of WO2004/016526A, and pages 9 and 16 of the WO99/46309A.

Further, for the inner wall of the container, quartz and an electropolished metal material (that is, a completely electropolished metal material) are also preferably used, in addition to the above-described fluorine-based resin.

The metal material used that is for producing the electropolished metal material is preferably a metal material which contains at least one selected from the group consisting of chromium and nickel, and has a total content of chromium and nickel of more than 25% by mass with respect to the total mass of the metal material, and examples thereof include stainless steel and a nickel-chromium alloy.

The total content of chromium and nickel in the metal material is preferably 25% by mass or more and more preferably 30% by mass or more with respect to the total mass of the metal material.

It is noted that the upper limit value of the total content of Cr and Ni in the metal material is not particularly limited; however, it is generally preferably 90% by mass or less.

The stainless steel is not particularly limited, and known stainless steel can be used.

Among them, an alloy containing nickel at 8% by mass or more is preferable, and austenitic stainless steel containing nickel at 8% by mass or more is more preferable. Examples of the austenitic stainless steels include SUS (Steel Use Stainless) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

The nickel-chromium alloy is not particularly limited, and known nickel-chromium alloys can be used. Among them, a nickel-chromium alloy having a nickel content of 40% to 75% by mass and a chromium content of 1% to 30% by mass is preferable.

Examples of the nickel-chromium alloy include HASTELLOY (product name, the same applies hereinafter), MONEL (product name, the same applies hereinafter), and INCONEL (product name, the same applies hereinafter). More specific examples thereof include HASTELLOY C-276 (Ni content: 63% by mass, Cr content: 16% by mass), HASTELLOY-C (Ni content: 60% by mass, Cr content:

17% by mass), and HASTELLOY C-22 (Ni content: 61% by mass, Cr content: 22% by mass).

In addition, the nickel-chromium alloy may further contain boron, silicon, tungsten, molybdenum, copper, cobalt, and the like as necessary, in addition to the above alloys.

A method of electropolishing a metal material is not particularly limited, and known methods can be used. For example, the methods described in paragraphs [0011] to [0014] of JP2015-227501A and paragraphs [0036] to [0042] of JP2008-264929A can be used.

In a case where the metal material is electropolished, it is presumed that a content of chromium in a passivation layer on a surface becomes larger than a content of chromium in a primary phase. As a result, it is presumed that since the metal element is unlikely to flow out into the washing solution from the inner wall coated with the electropolished metal material, the washing solution in which the specific metal element is reduced can be obtained.

The metal material is preferably subjected to buff polishing. A method of buff polishing is not particularly limited, and known methods can be used. The size of abrasive grains for polishing used for buff polishing finish is not particularly limited; however, it is preferably #400 or less from the viewpoint that then unevenness of the surface of the metal material is easily reduced.

The buff polishing is preferably carried out before the electropolishing.

In addition, the metal material may be treated by combining one or two or more of a plurality of stages of buff polishing, acid washing, magnetic fluid polishing, and the like, which are carried out by changing the count of the size or the like of the abrasive grains.

It is preferable to wash the inside of these containers before being filled. The liquid that is used for washing may be appropriately selected according to the intended use; however, it is preferably the washing solution, a liquid obtained by diluting the washing solution, or a liquid containing at least one of the components which are added to the washing solution.

In order to prevent the change in the components in the washing solution during storage, the inside of the container may be replaced with inert gas (nitrogen, argon, or the like) with a purity of 99.99995% by volume or more. In particular, a gas having a low moisture content is preferable. Although the liquid container body may be transported and stored at normal temperature, the temperature may be controlled in a range of −20° C. to 20° C. in order to prevent deterioration.

[Substrate Treatment Method]

Typically, the washing solution can be used by being brought into contact with a substrate containing a metal-based material, which is a material containing a metal. At this time, the substrate may contain a plurality of kinds of metal-based materials. In addition, the washing solution may dissolve at least one of metal-based materials contained therein, where a plurality of kinds of the metal-based materials may be contained therein.

It suffices that the metal-based material has metal atoms (cobalt (Co), ruthenium (Ru), molybdenum (Mo), aluminum (Al), copper (Cu), titanium (Ti), tungsten (W), tantalum (Ta), and/or the like), and examples thereof include a single body metal, an alloy, a metal oxide (which may be a composite oxide), and a metal nitride (which may be a composite nitride). In addition, examples of the metal-based material contained in the substrate also include a material that contains at least one element selected from the group consisting of a single body metal, an alloy, a metal oxide, and a metal nitride, and at least one element, as a dopant, selected from the group consisting of carbon, nitrogen, boron, and phosphorus.

The content of the metal atom in the metal-based material is preferably 30% to 100% by mass, more preferably 40% to 100% by mass, and still more preferably 50% to 100% by mass, with respect to the total mass of the metal-based material.

In a case where the metal-based material contains the above dopant, the content of the dopant of the metal atom is preferably 0.1% to 50% by mass and more preferably 10% to 40% by mass with respect to the total mass of the metal-based material. In that case, the content of the metal atom in the metal-based material is preferably 30% to 99.9% by mass and more preferably 60% to 90% by mass with respect to the total mass of the metal-based material.

[Substrate Washing Method]

The above-described washing solution is used in a washing method for a semiconductor substrate (hereinafter, also simply referred to as a "washing method"), which has a washing step B of washing a substrate including a metal layer. The substrate washing method may include a washing solution producing step A of preparing the washing solution, before the washing step B.

In the following description of the washing method, a case where the washing solution producing step A is carried out before the washing step B will be described as an example. However, the washing method is not limited to this example and may be carried out using the washing solution prepared in advance.

[Object to be Washed]

An object to be washed in the washing method is not particularly limited as long as it is a substrate including a metal layer, and it is preferably a substrate including a metal layer containing at least W. In addition, the object to be washed is preferably a substrate including a metal layer containing Co, Ti, Al, Ru, Mo, Ta, or Cu, and it is also preferably a substrate further including an SiN, SiOC, or SiOx layer in addition to the metal layer.

Examples of the object to be washed include a laminate in which at least a metal layer, an interlayer insulating film, and a metal hard mask are provided in this order on a substrate.

The laminate may further have holes formed from the surface (the opening portion) of the metal hard mask toward the substrate so that the surface of the metal layer is exposed, as a result of undergoing a dry etching step or the like.

A method of manufacturing such a laminate having holes as described above is not particularly limited. However, in general, examples thereof include a method in which a laminate before treatment, having a substrate, a metal layer, an interlayer insulating film, and a metal hard mask in this order, is subjected to a dry etching step by using a metal hard mask as a mask and an interlayer insulating film is etched so that the surface of the metal layer is exposed, thereby providing holes that penetrate through the metal hard mask and the inside of the interlayer insulating film.

It is noted that a manufacturing method for the metal hard mask is not particularly limited. For example, first, a metal layer containing a predetermined component is formed on an interlayer insulating film, and a resist film having a predetermined pattern is formed on the metal layer. Next, a method of manufacturing a metal hard mask (that is, a film in which a metal layer is patterned) by etching a metal layer using a resist film as a mask can be mentioned.

In addition, the laminate may have a layer other than the above-described layer, and it may have, for example, a layer such as an etching stop film, a barrier layer, and/or an antireflection layer.

FIG. 1 is a view illustrating a schematic cross-sectional view illustrating an example of a laminate which is an object to be washed in the washing method.

A laminate 10 illustrated in FIG. 1 includes a metal layer 2, an etching stop layer 3, an interlayer insulating film 4, and a metal hard mask 5 in this order on a substrate 1, and holes 6 by which the metal layer 2 is exposed is formed at a predetermined position as a result of a dry etching step. That is, the object to be washed illustrated in FIG. 1 is a laminate which includes the substrate 1, the metal layer 2, the etching stop layer 3, the interlayer insulating film 4, and the metal hard mask 5 in this order, in which the holes 6 that penetrate from the surface of the metal hard mask 5 to the surface of the metal layer 2 at the position of the opening portion of the metal hard mask 5. An inner wall 11 of the holes 6 is consisting of a cross-sectional wall 11*a* consisting of the etching stop layer 3, the interlayer insulating film 4, and the metal hard mask 5, and a bottom wall 11*b* consisting of the exposed metal layer 2, and dry etching residues 12 are attached to the inner wall 11.

The washing method using the present washing solution can be suitably used for washing for the intended purpose of removing the dry etching residues 12 that have adhered to the above-described laminate having a metal layer (particularly, a W-containing layer, a Co-containing layer, and/or a TiN-containing layer). That is, the present washing solution is excellent in the removal performance (residue removability) of the dry etching residues 12 from this laminate and is also excellent in the dissolution suppressing performance with respect to the inner wall 11 (for example, the metal layer 2 or the etching stop layer 3) of the object to be washed.

It is noted that the object to be washed in the washing method is not limited to the aspect illustrated in FIG. 1. For example, the object to be washed may a laminate which includes a metal layer, an etching stop layer, an interlayer insulating film, and a metal hard mask in this order on a substrate and in which, at a position of an opening portion of the metal hard mask, a hole penetrating the interlayer insulating film is formed by the dry etching step to expose the etching stop layer.

The inner wall of the hole of the laminate is composed of a cross-sectional wall where at least the side walls of the interlayer insulating film and the metal hard mask are exposed and a bottom wall composed of an exposed etching stop layer, and a washing method targeting this laminate as an object to be washed can be suitably applied to washing for the intended purpose of removing the dry etching residues that have adhered to the inner wall.

In addition, in the washing method using the present washing solution, at least a part of the etching stop layer may be removed at the same time while removing the dry etching residues from the above-described laminate.

In addition, a laminate that has undergone a dry ashing step after the dry etching step may be subjected to the washing method.

Hereinafter, each layer-constituting material of the above-described laminate will be described.

<Metal Hard Mask>

The metal hard mask preferably contains at least one selected from the group consisting of copper, cobalt, a cobalt alloy, tungsten, a tungsten alloy, ruthenium, a ruthenium alloy, tantalum, a tantalum alloy, aluminum oxide, aluminum nitride, aluminum oxynitride, titanium aluminum, titanium, titanium nitride (TiN), titanium oxide, zirconium oxide, hafnium oxide, tantalum oxide, lanthanum oxide, and a yttrium alloy (preferably YSiOx). Here, x and y are preferably numbers represented by x=1 to 3 and y=1 to 2, respectively.

Examples of the material of the metal hard mask include TiN, WC, $WO_2$, and $ZrO_2$.

<Interlayer Insulating Film>

The material of the interlayer insulating film is not particularly limited; however, it is preferably a material having a dielectric constant k of 3.0 or less and more preferably a material having a dielectric constant k of 2.6 or less.

Specific examples of the material of the interlayer insulating film include SiOx, SiN, SiOC, and an organic polymer such as polyimide. Here, x is preferably a number represented by 1 to 3.

<Etching Stop Layer>

The material of the etching stop layer is not particularly limited. Examples of the material constituting the etching stop layer include materials based on SiN, SiON, and SiOCN, and a metal oxide such as aluminum oxide (AlOx). Here, x is preferably a number represented by 1 to 3.

<Metal Layer>

The material that forms a metal layer, serving as a wiring line material and/or a plug material, is not particularly limited; however, it preferably contains tungsten. Examples of the material containing tungsten include a tungsten single body and an alloy of tungsten with another metal.

In addition, the material that forms a metal layer is also preferably a material containing one or more selected from the group consisting of cobalt, molybdenum, and copper. This material may be cobalt, molybdenum, or an alloy of copper with another metal.

The metal layer may further contain a metal other than cobalt, tungsten, ruthenium, molybdenum, and copper, a metal nitride, and/or an alloy. Examples of the metal other than cobalt, tungsten, ruthenium, molybdenum, and copper, which may be contained in the metal layer include titanium, titanium-tungsten, titanium nitride, tantalum, a tantalum compound, chromium, a chromium oxide, and aluminum.

The metal layer may contain at least one dopant selected from the group consisting of carbon, nitrogen, boron, and phosphorus, in addition to one or more selected from the group consisting of cobalt, tungsten, ruthenium, molybdenum, and copper.

<Substrate>

The "substrate" referred to herein includes, for example, a semiconductor substrate consisting of a single layer and a semiconductor substrate consisting of multiple layers.

The material constituting a semiconductor substrate consisting of a single layer is not particularly limited, and, in general, it is preferably composed of a Group III-V compound, such as silicon, silicon germanium, or GaAs, or any combination thereof.

In a case of a semiconductor substrate consisting of multiple layers, the configuration thereof is not particularly limited, and it may have exposed integrated circuit structures such as interconnect structures (interconnect features) such as a metal wiring line and a dielectric material, for example, on the above-described semiconductor substrate such as silicon. Examples of the metal and the alloy which are used in the interconnect structure include aluminum, aluminum alloyed with copper, copper, titanium, tantalum, cobalt, silicon, titanium nitride, tantalum nitride, and tungsten, which are not limited thereto. In addition, a layer of an interlayer dielectric layer, silicon oxide, silicon nitride, silicon carbide, or silicon oxide doped with carbon may be provided on the semiconductor substrate.

(Barrier Layer)

The laminate may have a barrier layer. The barrier layer is a layer that is formed between a metal layer serving as a wiring line material and/or plug material provided on a substrate and an interlayer insulating film, and it is a layer (film) for preventing the diffusion of the wiring line material and/or the plug material.

Examples of the material of the barrier layer include a metal material having a low resistance, and the material thereof preferably includes at least one selected from the group consisting of tantalum or a tantalum compound, titanium or a titanium compound, tungsten or a tungsten compound, and ruthenium and more preferably includes at least one selected from the group consisting of TiN, TiW, Ta, TaN, W, WN, and Ru, and it is still more preferably TiN.

A manufacturing method for an object to be washed is not particularly limited as long as it is a method known in the field of the semiconductor substrate.

Examples of the method of forming a metal layer (a metal-containing film or a metal-containing wiring line) on a substrate include a sputtering method, a physical vapor deposition (PVD) method, an atomic layer deposition (ALD) method, a chemical vapor deposition (CVD) method, and a molecular beam epitaxy (MBE) method. It is noted that in a case where a metal-containing film is formed according to a sputtering method, a PVD method, an ALD method, a CVD method, or the like, a metal-containing substance may also adhere to the back surface of the substrate having the metal-containing film (the surface opposite to the side of the metal-containing film).

In addition, a metal-containing wiring line may be formed on a substrate by carrying out the above-described method through a predetermined mask.

In addition, after forming the metal layer on the substrate, this substrate may be subjected to a different step or a different treatment and then used as an object to be washed in the present washing method.

For example, a substrate having a metal layer may be subjected to dry etching to manufacture a substrate having a dry etching residue containing a metal. The dry etching residue is a by-product generated by carrying out dry etching (for example, plasma etching), and examples thereof include an organic residue derived from a photoresist, an Si-containing residue derived from an interlayer insulating film, and a metal-containing residue. In addition, a substrate having a metal layer may be subjected to CMP to manufacture a substrate having a metal-containing substance.

Hereinafter, the substrate washing method will be described for each step.

[Washing Solution Producing Step A]

The washing solution producing step A is a step of preparing the washing solution. Each component that is used in this step is as described above. In addition, the details of this step are as described in the column of [Production method for washing solution] described above.

The procedure of this step is not particularly limited, and examples thereof include a method of preparing a washing solution by stirring and mixing predetermined components. It is noted that each component may be added at one time or may be dividedly added over a plurality of times.

In addition, as each component contained in the washing solution, a component classified into a semiconductor grade or a component classified into a high-purity grade equivalent thereto is used, and it is preferable to use a component in which foreign matters are removed by filtering and/or ion components are reduced by an ion exchange resin or the like.

In addition, after mixing the raw material components, it is preferable to reduce the ion components by the removal of foreign matters by filtering and/or the treatment with an ion exchange resin or the like.

Further, in a case where the washing solution is a concentrated solution, the concentrated solution is diluted 5 to 2,000 times to obtain a diluent liquid before carrying out the washing step B, and then the washing step B is carried out using this diluent liquid. The solvent for diluting a concentrated solution is preferably at least one selected from the group consisting of water, alcohol, and an aprotic polar solvent, which are contained in the washing solution.

[Washing Step B]

Examples of the object to be washed in the washing step B include the above-described laminate, and more specific examples thereof include a substrate including a metal layer containing W. In addition, examples of the object to be washed include a laminate that has undergone a dry etching step to form holes, as described above (see FIG. 1). It is noted that the dry etching residues adhere to the holes in the laminate. In addition, a laminate that has undergone a dry ashing step after the dry etching step may be used as the object to be washed.

A method of bringing the washing solution into contact with an object to be washed is not particularly limited. However, examples thereof include a method of immersing an object to be washed, in the washing solution charged in a tank, a method of spraying the washing solution onto an object to be washed, a method of allowing the washing solution to flow onto an object to be washed, and any combination thereof. From the viewpoint of residue removability, a method of immersing an object to be washed, in the washing solution, is preferable.

The temperature of the washing solution in the washing step B is preferably 90° C. or less, more preferably 25° C. to 80° C., still more preferably 30° C. to 75° C., particularly preferably 40° C. to 70° C., and most preferably more than 60° C. and 70° C. or less.

The present washing solution exhibits excellent dissolution suppressing performance of the metal layer even under the conditions in which the temperature of the washing solution is relatively high and the dissolution of the metal layer such as the Co-containing layer, the W-containing layer, or the AlOx layer proceeds easily.

The washing time can be adjusted according to the washing method to be used and the temperature of the washing solution to be used.

In a case of carrying out washing by an immersion batch method (a batch method in which a plurality of objects to be washed are immersed and treated in a treatment tank), the washing time is, for example, within 90 minutes, and it is preferably 1 to 90 minutes, more preferably 5 to 60 minutes, and still more preferably 10 to 45 minutes.

In a case of carrying out washing by the single substrate method, the washing time is, for example, 10 seconds to 5 minutes, and it is preferably 15 seconds to 4 minutes, more preferably 15 seconds to 3 minutes, and still more preferably 20 seconds to 2 minutes.

Further, in order to further improve the washing ability of the washing solution, a mechanical stirring method may be used.

Examples of the mechanical stirring method include a method of circulating a washing solution on an object to be washed, a method of flowing or spraying a washing solution on an object to be washed, and a method of stirring a washing solution with an ultrasonic wave or a megasonic wave.

[Rinsing Step B2]

The substrate washing method may further include a step of rinsing the object to be washed with a solvent (hereinafter, referred to as a "rinsing step B2"), after the washing step B.

The rinsing step B2 is carried out continuously after the washing step B, and it is preferably a step of carrying out rising with a rinsing solvent (a rinsing liquid) for 5 seconds to 5 minutes. The rinsing step B2 may be carried out using the above-described mechanical stirring method.

Examples of the solvent of the rinsing liquid include deionized water (DIW), methanol, ethanol, isopropanol, N-methylpyrrolidinone, γ-butyrolactone, dimethyl sulfoxide, ethyl lactate, and propylene glycol monomethyl ether acetate.

The solvent of the rinsing liquid is preferably DIW, methanol, ethanol, isopropanol, or a mixed liquid thereof, and more preferably DIW, isopropanol, or a mixed liquid of DIW and isopropanol.

As a method of bringing the rinsing solvent into contact with the object to be washed, the above-described method of bringing the above-described washing solution into contact with the object to be washed can be similarly applied.

The temperature of the rinsing solvent in the rinsing step B2 is preferably 10° C. to 40° C.

[Drying Step B3]

The substrate washing method may include a drying step B3 of drying the object to be washed, after the rinsing step B2.

The drying method is not particularly limited. Examples of the drying method include a spin drying method, a method of flowing a dry gas onto an object to be washed, a method of heating a substrate by a heating means such as a hot plate and an infrared lamp, a Marangoni drying method, a Rotagoni drying method, an isopropanol (IPA) drying method, and any combinations thereof.

The drying time in the drying step B3 depends on the specific drying method; however, it is preferably 20 seconds to 5 minutes.

The heating temperature in a case where a substrate is dried by heating is not particularly limited; however, it is, for example, 50° C. to 350° C. and preferably 150° C. to 250° C.

[Coarse Particle Removal Step H]

After the washing solution preparation step A and before the washing step B, the substrate washing method preferably has a coarse particle removal step H of removing coarse particles in the washing solution.

In a case of reducing or removing the coarse particles in the washing solution, it is possible to reduce the amount of the coarse particles remaining on the object to be washed after undergoing the washing step B. As a result, it is possible to suppress the pattern damage caused by the coarse particles on the object to be washed, and it is also possible to suppress the influence on the decrease in the yield and the decrease in the reliability of the device.

Examples of the specific method for removing the coarse particles include a method of filtering and purifying the washing solution that has undergone the washing solution producing step A, by using a particle removal film having a predetermined particle removal diameter.

It is noted that the definition of the coarse particle is as described above.

[Destaticization Steps I and J]

It is preferable that the substrate washing method include at least one step selected from the group consisting of a destaticization step I of destaticizing the water that is used in the preparation of a washing solution before the washing solution producing step A and a destaticization step J of destaticizing the washing solution after the washing solution preparation step A and before the washing step B.

It is preferable that a material of a liquid contact portion for supplying the washing solution to the object to be washed is formed of or coated with a material in which metal elution due to the washing solution does not occur. Examples of the above-described material include the material already described as the material involved in the inner wall of the container that can be used in the liquid container body.

The above-described material may be a resin. In a case where the above-described material is a resin, the resin has a low electrical conductivity and insulating properties in a large number of cases. As a result, for example, in a case where the washing solution is allowed to pass through a pipe of which the inner wall is formed of or coated with a resin, or in a case where it is subjected to filtration and purification with a particle removal film made of a resin and an ion exchange resin film made of a resin, the charged potential of the washing solution may increase, which causes an electrostatic disaster.

Therefore, in the substrate washing method, it is preferable to carry out at least one of the destaticization step I or the destaticization step J described above to reduce the charged potential of the washing solution. In addition, in a case of carrying out destaticization, it is possible to further suppress the adhesion of foreign matters (coarse particles or the like) to the substrate and/or the damage (the corrosion) to the object to be washed.

Specific examples of the destaticization method include a method of bringing water and/or the washing solution into contact with a conductive material.

The contact time during which the water and/or the washing solution is brought into contact with a conductive material is preferably 0.001 to 1 second and more preferably 0.01 to 0.1 second.

Examples of the resin include high-density polyethylene (HDPE), high-density polypropylene (PP), 6,6-nylon, tetrafluoroethylene (PTFE), a copolymer (PFA) of tetrafluoroethylene and perfluoroalkyl vinyl ether, polychlorotrifluoroethylene (PCTFE), an ethylene-chlorotrifluoroethylene copolymer (ECTFE), an ethylene-ethylene tetrafluoride copolymer (ETFE), and an ethylene tetrafluoride-propylene hexafluoride copolymer (FEP).

Examples of the conductive material include stainless steel, gold, platinum, diamond, and glassy carbon.

The substrate washing method may be a substrate washing method that has the washing solution producing step A, the washing step B, a waste liquid recovery step C of recovering a waste liquid of the washing solution used in the washing step B, a washing step D of washing a substrate including a newly prepared and predetermined layer by using the recovered waste liquid of the washing solution, and a waste liquid recovery step E of recovering the waste liquid of the washing solution, used in the washing step D, where the washing step D and the waste liquid recovery step E are repeatedly carried out to recycle the waste liquid of the washing solution.

In the above-described substrate washing method, aspects of the washing solution producing step A and the washing step B are as described above. In addition, it is preferable that the aspect of reusing the waste liquid also has the above-described coarse particle removal step H and the above-described destaticization steps I and J.

The aspect of the washing step D of carrying out the washing of the substrate using the waste liquid of the recovered washing solution is as described regarding the washing step B.

The waste liquid recovery means in the waste liquid recovery steps C and E is not particularly limited. The recovered waste liquid is preferably stored in the above-described container in the destaticization step J, and at the time of the storage, the same destaticization step as in the destaticization step J may be carried out. In addition, a step of removing impurities by subjecting the recovered waste liquid to filtration or the like may be provided.

EXAMPLES

Hereinbelow, the present invention will be described in more detail with reference to Examples. The materials, amounts of use, proportions, treatments, procedures, and the like described in the following Examples can be appropriately modified as long as the gist of the invention is maintained. As a result, the scope of the present invention should not be construed to be limited by Examples described below.

Examples 1 to 26 and Comparative Examples 1 to 5

[Preparation of Washing Solution]

Each component shown in Table 1 was prepared, added, and mixed according to the formulation ratio shown in Table 1, and as necessary, hydrochloric acid or tetramethylammonium hydroxide (TMAH) was added thereto so that the pH of the washing solution was the numerical value shown in Table 1, thereby preparing a washing solution of each of Examples and Comparative Examples. The content of each component contained in each washing solution (each based on mass) is as described in the table.

All the various components used in the preparation of each washing solution were those classified into a semiconductor grade or those classified into a high-purity grade equivalent thereto.

<Component>

The various components listed in Table 1 are shown below.

(Hydroxylamine Compound)

HA: Hydroxylamine (Component A)

A-1: 2-(2-aminoethoxy)ethanol

A-2: 2-(2-aminoethylamino)ethanol

A-3: 2,2'-oxybis(ethylamine)

A-4: Diethylenetriamine (Water)

Deionized water (DIW)

(Alcohol)

Hexylene glycol 2-ethoxyethanol 1,3-butanediol

Glycerol 2,4-pentanediol (Azole Compound)

BTA: 1H-benzotriazole

TTA: Tolyltriazole

1H-TA: 1H-tetrazole

Irgamet 42: 2,2'-{[(4-methyl-1H-benzotriazole-1-yl)methyl]imino}bisethanol

5MBTA: 5-methyl-1H-benzotriazole (Quaternary Ammonium Hydroxide)

TMAH: Tetramethylammonium hydroxide

BzTMAH: Benzyltrimethylammonium hydroxide

TBAH: Tetrabutylammonium hydroxide (Other Components)

B-1: 4-methyl-1,3-pentadiene (component B)

B-2: 4-methyl-3-pentene-2-ol (component B)

B-3: 2,4,4,6-tetramethyl-1,3-dioxane (component B)

B-4: Isobutene (component B)

B-5: (E)-2-methyl-1,3-pentadiene (component B)

B-6: 2,2,4-trimethyloxetane (component B)

C-1: 2-aminoethanol (component C)

C-2: ethylenediamine (component C)

[Evaluation]

[Washing Performance]

A laminate in which an $SiO_2$ film having a thickness of 100 nm was laminated on a substrate (Si) was prepared. This laminate was subjected to plasma etching with a gas containing fluorine using a TiN metal hard mask as a mask, to subject the $SiO_2$ film to etching of about 50 nm, thereby producing a test piece for an evaluation test, in which a lattice form pattern of the 2 cm square was formed. As a result of analyzing the etched bottom surface by X-ray photoelectron spectroscopy (XPS), the fluorine presumed to be derived from the dry etching residue was detected. It is presumed that the dry etching residue formed by plasma etching using the above-described gas containing fluorine is an organic/inorganic mixed residue encompassing Si and O derived from $SiO_2$ and C and F derived from the etching gas.

Next, the washing performance of each washing solution was evaluated according to the following procedure.

A glass beaker having a volume of 500 mL was filled with 200 mL of the washing solution. The temperature of the washing solution was raised to 65° C. while carrying out stirring using a stirrer. Next, the test piece prepared as described above was immersed with stirring in a washing solution having a liquid temperature of 65° C. until a predetermined washing time elapsed, whereby the test piece was washed. While the test piece was immersed in the washing solution, the test piece was held using plastic locking tweezers having a length of 4 inches so that the surface of the test piece, from which the residue had been removed, faced the stirrer.

After the predetermined washing time elapsed, the test piece was immediately taken out from the washing solution and placed in a 500 mL plastic beaker filled with 400 mL of DI water (water temperature: 20° C.) in a state of being gently stirred. After the test piece was immersed in DI water for 30 seconds, the test piece was immediately taken out and rinsed under a DI water flow at 20° C. for 30 seconds.

Subsequently, the test piece was exposed to a stream of nitrogen gas to blow off liquid droplets that had adhered to the surface of the test piece, whereby the surface of the test piece was dried.

After this nitrogen drying step, the test piece was removed from the holding portion of the plastic tweezers, and the test piece was placed and stored in a plastic storage box attached with a lid, with the element side facing up.

The composition analysis of the surface of the obtained test piece was carried out using an XPS apparatus (manufactured by ULVAC-PHI, Inc., product name: Quantera SXM) to measure the content (% by atom) of the fluorine atom derived from the dry etching residue on the surface of the test piece.

Each washing solution was subjected to the above-described washing test by changing the washing time from 30 seconds to 300 seconds by 10 seconds, and the shortest time (hereinafter, referred to as the "washing completion time") was determined among the washing times at which the content of the fluorine atom amount on the surface of the test piece after washing was 1% by atom or less.

From the obtained washing completion time, the washing performance (the removal performance for the dry etching residue) of each washing solution was evaluated based on the following evaluation standards. It can be said that the shorter the washing completion time of the washing solution, the better the washing performance of the washing solution. It is noted that the content of the fluorine atom amount on the surface of the test piece before washing, where the test piece had been subjected to the above-described plasma etching, was 4% to 5% by atom.

(Evaluation Standards for Washing Performance)

A: The washing completion time was less than 90 seconds.

B: The washing completion time was 90 seconds or more and less than 120 seconds.

C: The washing completion time was 120 seconds or more and less than 150 seconds.

D: The washing completion time was 150 seconds or more and 300 seconds or less.

E: The content of the fluorine atom amount on the surface of the test piece did not fall below the above-described reference value even after the washing was carried out for 300 seconds according to the above-described washing test.

[Dissolution Suppressing Performance]

A substrate on which a film (a Co film) consisting of metallic cobalt was formed was prepared on one surface of a commercially available silicon wafer (diameter: 12 inches).

Regarding a specific method for forming the Co film, first, a Co film having a thickness of 10 nm was formed according to a CVD method, and then a Co film having a total thickness of 5,000 nm was formed according to an electrolytic plating method. Each of the washing solutions of Examples and Comparative Examples was used to carry out the washing treatment of the obtained Co film. Specifically, after immersing the Co film in each of the washing solutions of Examples and Comparative Examples for 60 minutes, a rinsing treatment of carrying out rinsing in pure water for 15 seconds was carried out twice, and subsequently, the substrate was dried with nitrogen gas. The dissolution rate (A/min) was calculated based on the difference in the film thickness of the Co film before and after the immersion in the washing solution.

Substrates on which a film consisting of W (a W film), a film consisting of TiN (a TiN film), and a film consisting of AlOx (an AlOx film) were respectively formed on one surface of a commercially available silicon wafer (diameter: 12 inches) were prepared. Regarding a specific method for forming each film, first, a film having a thickness of 5 nm was formed according to an ALD method, and then a film having a total thickness of 5,000 nm was formed according to a CVD method. Next, in the same manner as described above, each substrate was immersed in each washing solution, and the dissolution rate (Å/min) of each film was measured.

The dissolution suppressing performance of the washing solution was evaluated based on the measured dissolution rate of each film.

It is noted that the thickness of each film formed on the substrate was measured according to the following method.

The thicknesses of the Co film, the W film, and the TiN film were measured according to an X-ray fluorescence analysis method (X-ray fluorescence spectroscopy: XRF) using a fluorescence X-ray analysis apparatus ("AZX400" manufactured by Rigaku Corporation).

The thickness of the AlOx film was measured using ellipsometry (spectral ellipsometer: product name "Vase", manufactured by J.A. Woollam Japan Corp.) under the conditions of a measurement range of 250 to 1,000 nm and a measurement angle of 70 degrees and 75 degrees.

Table 1 summarizes the measurement results.

Table 1 below shows the washing solution of the etchant and the evaluation results in each Example and Comparative Example.

In the table, the notation "(%)" indicates the ratio of the content of the component to the total mass of the washing solution.

In the table, the column "Ratio 1" indicates the ratio of the content of the hydroxylamine compound (hydroxylamine compound/component A) to the content of the component A in each washing solution, in terms of mass ratio.

The column of "Washing solution pH" indicates the pH of each washing solution, which is measured using a pH meter at 25° C.

TABLE 1

| | Washing solution composition | | | | | | | | | | | | | | Evaluation | | | | |
|---|---|---|---|---|---|---|---|---|---|---|---|---|---|---|---|---|---|---|---|
| | HA | Component A | | Ratio | Water | Alcohol | | Azole compound | | Quaternary ammonium hydroxide | | Other components | | Washing solution | Washing | Dissolution rate (Å/min., 65° C.) | | | |
| | (%) | Kind | (%) | 1 | (%) | Kind | (%) | Kind | (%) | Kind | (%) | Kind | (%) | pH | performance | Co | W | TIN | AlOx |
| Example 1 | 10.0 | A-2 | 0.58 | 17.2 | 75.0 | Hexylene glycol | 15.0 | | | | | | | 10.5 | B | 11.7 | 4.4 | 2.5 | 42.9 |
| Example 2 | 10.0 | A-3 | 0.41 | 24.4 | 75.0 | Hexylene glycol | 15.0 | | | | | | | 10.5 | B | 9.9 | 5.4 | 2.3 | 32.5 |
| Example 3 | 10.0 | A-4 | 0.19 | 52.6 | 75.0 | Hexylene glycol | 15.0 | | | | | | | 10.5 | B | 13.0 | 5.4 | 3.0 | 41.4 |
| Example 4 | 10.0 | A-2 | 0.58 | 17.2 | 40.0 | Hexylene glycol | 50.0 | | | | | | | 10.0 | B | 8.5 | 4.0 | 1.7 | 20.5 |
| Example 5 | 10.0 | A-3 | 0.53 | 18.9 | 75.0 | 2-ethoxyethanol | 15.0 | | | | | | | 10.5 | C | 8.5 | 5.9 | 3.0 | 38.0 |
| Example 6 | 10.0 | A-2 | 0.20 | 25.0 | 40.0 | Hexylene glycol | 50.0 | | | | | | | 9.9 | B | 7.3 | 4.5 | 2.1 | 17.3 |
| | | A-3 | 0.20 | | | | | | | | | | | | | | | | |
| Example 7 | 10.0 | A-3 | 0.41 | 24.4 | 75.0 | Hexylene glycol | 15.0 | | | | | B-1 | 0.001 | 10.5 | A | 9.1 | 5.1 | 2.3 | 39.8 |
| Example 8 | 10.0 | A-3 | 0.19 | 52.6 | 40.0 | Hexylene glycol | 50.0 | | | | | B-2 | 0.005 | 10.2 | A | 7.3 | 4.3 | 2.1 | 22.2 |
| Example 9 | 10.0 | A-3 | 0.19 | 52.6 | 80.0 | Hexylene glycol | 5.0 | | | | | | | 10.0 | A | 7.0 | 4.0 | 2.0 | 22.2 |
| | | | | | | 1,3-butanediol | 5.0 | | | | | | | | | | | | |
| Example 10 | 10.0 | A-2 | 0.58 | 17.2 | 20.0 | Hexylene glycol | 70.0 | | | | | B-3 | 0.01 | 10.0 | A | 8.0 | 2.7 | 1.2 | 6.3 |
| Example 11 | 10.0 | A-2 | 0.58 | 17.2 | 86.0 | Glycerol | 4.0 | | | | | B-4 | 0.02 | 10.9 | C | 12.1 | 4.5 | 2.0 | 51.5 |
| Example 12 | 5.0 | A-2 | 0.58 | 8.6 | 85.0 | Hexylene glycol | 10.0 | | | | | B-5 | 0.05 | 11.0 | A | 9.3 | 4.5 | 2.1 | 62.1 |
| Example 13 | 11.0 | A-3 | 0.41 | 26.8 | 69.0 | Hexylene glycol | 20.0 | | | | | B-6 | 0.002 | 9.8 | A | 8.7 | 4.4 | 1.7 | 33.9 |
| Example 14 | 10.0 | A-3 | 0.41 | 24.4 | 20.0 | Hexylene glycol | 70.0 | | | | | | | 10.5 | B | 7.6 | 2.4 | 1.0 | 5.6 |
| Example 15 | 10.0 | A-2 | 0.58 | 17.2 | 86.0 | Glycerol | 4.0 | | | | | | | 10.5 | C | 11.4 | 4.6 | 2.8 | 50.5 |
| Example 16 | 5.0 | A-2 | 0.58 | 8.6 | 84.9 | Hexylene glycol | 10.0 | | | TMAH | 0.11 | | | 10.8 | A | 7.5 | 2.4 | 1.5 | 55.7 |
| Example 17 | 7.0 | A-3 | 0.41 | 17.1 | 77.9 | 1,3-butanediol | 15.0 | | | BzTMAH | 0.07 | | | 10.9 | B | 4.5 | 2.4 | 1.2 | 59.7 |
| Example 18 | 11.0 | A-2 | 0.58 | 19.0 | 68.6 | Hexylene glycol | 20.0 | 1H-BTA | 0.2 | TBAH | 0.12 | B-5 | 0.05 | 11.0 | A | 3.8 | 4.0 | 1.5 | 60.7 |
| Example 19 | 10.0 | A-3 | 0.38 | 26.3 | 74.8 | Hexylene glycol | 15.0 | TTA | 0.2 | | | | | 10.2 | B | 2.1 | 3.1 | 1.4 | 40.2 |
| Example 20 | 10.0 | A-3 | 0.38 | 26.3 | 74.8 | Hexylene glycol | 15.0 | TTA | 0.1 | | | | | 11.0 | B | 1.9 | 3.3 | 1.2 | 63.2 |
| | | | | | | | | 1H-BTA | 0.1 | | | | | | | | | | |
| Example 21 | 8.0 | A-3 | 0.27 | 29.6 | 76.8 | 2,4-pentanediol | 15.0 | 1H-TA | 0.2 | | | | | 9.8 | C | 2.9 | 3.2 | 1.9 | 36.2 |
| Example 22 | 9.0 | A-3 | 0.24 | 37.5 | 70.8 | Hexylene glycol | 20.0 | Irgamet 42 | 0.2 | | | | | 9.5 | B | 2.0 | 2.8 | 1.0 | 30.2 |
| Example 23 | 8.0 | A-3 | 0.09 | 88.9 | 77.0 | Hexylene glycol | 15.0 | | | | | | | 9.8 | B | 11.5 | 4.6 | 3.9 | 24.5 |
| Example 24 | 5.0 | A-2 | 0.58 | 8.6 | 85.0 | Hexylene glycol | 10.0 | | | | | C-1 | 0.005 | 11.0 | A | 9.0 | 4.0 | 2.5 | 62.1 |
| Example 25 | 5.0 | A-2 | 0.58 | 8.6 | 85.0 | Hexylene glycol | 10.0 | | | | | C-2 | 0.005 | 11.0 | A | 9.3 | 4.4 | 2.2 | 62.1 |
| Example 26 | 10.0 | A-4 | 1.20 | 8.3 | 75.0 | Hexylene glycol | 15.0 | | | | | | | 10.8 | B | 14.2 | 4.0 | 1.9 | 57.8 |
| Comparative Example 1 | 10.0 | — | | — | 74.6 | Hexylene glycol | 15.0 | | | | | C-1 | 0.36 | 10.5 | C | 11.8 | 6.6 | 5.2 | 40.9 |
| Comparative Example 2 | — | A-2 | 0.58 | — | 85.0 | Hexylene glycol | 15.0 | | | | | | | 10.6 | E | 10.2 | 4.0 | 1.7 | 55.6 |
| Comparative Example 3 | 2.0 | A-2 | 0.72 | 2.8 | 48.0 | Hexylene glycol | 50.0 | | | | | | | 10.1 | E | 11.3 | 6.3 | 0.1 | 25.6 |
| Comparative Example 4 | 10.0 | A-2 | 0.03 | 333.3 | 40.0 | Hexylene glycol | 50.0 | | | | | | | 9.3 | B | 10.3 | 9.1 | 5.4 | 20.7 |
| Comparative Example 5 | 20.0 | A-1 | 15.0 | 1.3 | 79.5 | — | | 5MBTA | 0.5 | | | | | 11.7 | B | 6.1 | 6.8 | 7.2 | 67.2 |

From the results shown in Table 1, it has been confirmed that the present washing solution is more excellent in the effect of the present invention as compared with the washing solutions of Comparative Examples.

It has been confirmed that in a case where the alcohol contained in the washing solution is a polyhydric alcohol, the dissolution suppressing performance with respect to the TiN-containing layer is excellent as compared with a case where the alcohol contained in the washing solution is a monoalcohol (the comparison between Examples 2 and 5, and the like).

It has been confirmed that in a case where the washing solution contains two or more kinds of the polyhydric alcohols represented by Formula (2), the washing performance is more excellent (the comparison between Examples 2 and 9, and the like).

It has been confirmed that in a case where the washing solution contains a quaternary ammonium hydroxide, at least any one of the washing performance or the dissolution suppressing performance with respect to the Co-containing layer, the W-containing layer, and/or the TiN-containing layer is more excellent (the comparison among Examples 1 and 2 and 16 to 18).

It has been confirmed that in a case where the washing solution contains the component B, the washing performance is more excellent (the comparison among Examples 1, 2, 7, 8, and 10 to 13).

It has been confirmed that in a case where the washing solution contains the component C, the washing performance is more excellent (the comparison among Examples 1, 24, and 25).

EXPLANATION OF REFERENCES

1: substrate
2: metal layer
3: etching stop layer
4: interlayer insulating film
5: metal hard mask
6: hole
10: laminate
11: inner wall
11*a*: cross-sectional wall
11*b*: bottom wall
12: dry etching residue

What is claimed is:

1. A washing solution for a semiconductor device, comprising:

a hydroxylamine compound that is at least one selected from the group consisting of hydroxylamine and a hydroxylamine salt;

a component A represented by Formula (1); and water, wherein a mass ratio of a content of the hydroxylamine compound to a content of the component A is 5 to 200, $$NH_2—CH_2CH_2—X—CH_2CH_2—Y \quad (1)$$

in Formula (1), X represents —NR— or —O—, R represents a hydrogen atom or a substituent, and Y represents a hydroxy group or a primary amino group.

2. The washing solution according to claim 1, further comprising:

alcohol.

3. The washing solution according to claim 2, wherein the alcohol includes a polyhydric alcohol having two or more hydroxy groups.

4. The washing solution according to claim 2, wherein the alcohol includes a compound represented by Formula (2), $$HO—C(R^1)_2—C(R^2)_2—C(R^3)_2—OH \quad (2)$$

in Formula (2), $R^1$, $R^2$, and $R^3$ represent a hydrogen atom, a hydroxy group, or an alkyl group which may have a hydroxy group, where a plurality of $R^1$'s, a plurality of $R^2$'s, and a plurality of $R^3$'s may be respectively the same or different from each other.

5. The washing solution according to claim 4, wherein the alcohol includes two or more kinds of the compounds represented by Formula (2).

6. The washing solution according to claim 2, wherein the alcohol includes at least one selected from the group consisting of 1,3-propanediol, 1,3-butanediol, 2-methyl-1,3-propanediol, glycerol, 2,4-pentanediol, 2,2-dimethyl-1,3-propanediol, and hexylene glycol.

7. The washing solution according to claim 2, wherein the alcohol includes hexylene glycol.

8. The washing solution according to claim 1, wherein the component A includes at least one selected from the group consisting of 2-(2-aminoethylamino) ethanol, 2,2'-oxybis(ethylamine), and 2-(2-aminoethoxy)ethanol.

9. The washing solution according to claim 1, wherein the component A includes 2-(2-aminoethylamino)ethanol or 2,2'-oxybis(ethylamine).

10. The washing solution according to claim 1, wherein a content of the component A is 0.1% to 1% by mass with respect to a total mass of the washing solution.

11. The washing solution according to claim 1, further comprising:

an azole compound.

12. The washing solution according to claim 1, further comprising:

a quaternary ammonium hydroxide.

13. The washing solution according to claim 12, wherein at least one of four hydrocarbon groups that are substituted in a quaternary ammonium cation contained in the quaternary ammonium hydroxide is a hydrocarbon group having two or more carbon atoms.

14. The washing solution according to claim 1, further comprising:

a component B that is at least one kind selected from the group consisting of isobutene, (E)-2-methyl-1,3-pentadiene, 4-methyl-1,3-pentadiene, 2,2,4-trimethyloxetane, 4-methyl-3-pentene-2-ol, and 2,4,4,6-tetramethyl-1,3-dioxane, wherein in a case where the washing solution contains one kind of the component B, a content of the component B with respect to a total mass of the washing solution is 0.1% by mass or less, and in a case where the washing solution contains two or more kinds of the components B, a content of each of the components B with respect to the total mass of the washing solution is 0.1% by mass or less.

15. The washing solution according to claim 1, further comprising:

a component C that is at least one kind selected from the group consisting of ethylenediamine and 2-aminoethanol, wherein in a case where the washing solution contains one kind of the component C, a content of the component C with respect to a total mass of the washing solution is 5.0% by mass or less, and in a case where the washing solution contains two or more kinds of the components C, a content of each of the components C with respect to the total mass of the washing solution is 2.5% by mass or less.

16. The washing solution according to claim 1, wherein a pH at 25° C. is 8 to 14.

17. The washing solution according to claim 1, wherein a pH at 25° C. is 9 to 12.

18. A washing method for a semiconductor substrate, comprising:

a washing step of washing a semiconductor substrate including a metal layer, by using the washing solution according to claim 1.

19. The washing method for a semiconductor substrate according to claim 18, wherein the metal layer contains tungsten, and a dry etching residue adhering to the semiconductor substrate is removed by the washing step.

20. The washing method for a semiconductor substrate according to claim 18, wherein the semiconductor substrate has a layer containing cobalt or titanium nitride, and the dry etching residue adhering to the semiconductor substrate is removed by the washing step.

21. The washing method for a semiconductor substrate according to claim 18, wherein the semiconductor substrate has an etching stop layer composed of aluminum oxide, and at least a part of the etching stop layer is removed by the washing step.

* * * * *